(12) United States Patent
Itou et al.

(10) Patent No.: US 8,907,425 B2
(45) Date of Patent: Dec. 9, 2014

(54) SEMICONDUCTOR DEVICE

(75) Inventors: Satoru Itou, Hyogo (JP); Toshie Kutsunai, Osaka (JP)

(73) Assignee: Panasonic Corporation, Osaka (JP)

( * ) Notice: Subject to any disclaimer, the term of this patent is extended or adjusted under 35 U.S.C. 154(b) by 30 days.

(21) Appl. No.: 13/528,526

(22) Filed: Jun. 20, 2012

(65) Prior Publication Data

US 2012/0256266 A1 Oct. 11, 2012

Related U.S. Application Data

(63) Continuation of application No. PCT/JP2010/005117, filed on Aug. 19, 2010.

(30) Foreign Application Priority Data

Jan. 7, 2010 (JP) .................................. 2010-002225

(51) Int. Cl.
| | | |
|---|---|---|
| H01L 27/088 | (2006.01) | |
| H01L 21/8238 | (2006.01) | |
| H01L 29/165 | (2006.01) | |
| H01L 29/66 | (2006.01) | |
| H01L 29/78 | (2006.01) | |

(52) U.S. Cl.
CPC ... *H01L 21/823871* (2013.01); *H01L 21/823807* (2013.01); *H01L 21/823814* (2013.01);
(Continued)

(58) Field of Classification Search
CPC . H01L 21/8238; H01L 27/092; H01L 27/088; H01L 29/78
USPC ........... 257/18–20, 55, 63–70, 178, 192, 213, 257/272–274, 368–369, E31.049, E29.193, 257/E27.059–E27.067, E21.43–E21.434, 257/E21.619, E21.634
See application file for complete search history.

(56) References Cited

U.S. PATENT DOCUMENTS

| | | |
|---|---|---|
| 6,281,562 B1 | 8/2001 | Segawa et al. |
| 6,621,131 B2 | 9/2003 | Murthy et al. |

(Continued)

FOREIGN PATENT DOCUMENTS

| | | |
|---|---|---|
| JP | 2006080161 A | 3/2006 |
| JP | 2008-124171 | 5/2008 |

(Continued)

OTHER PUBLICATIONS

International Search Report issued in International Patent Application No. PCT/JP2010/005117, mailed on Nov. 9, 2010.

(Continued)

*Primary Examiner* — Fernando L Toledo
*Assistant Examiner* — Lawrence-Linh T Nguyen
(74) *Attorney, Agent, or Firm* — McDermott Will & Emery LLP

(57) ABSTRACT

A semiconductor device has a first MIS transistor. The first MIS transistor includes a first source/drain region of a first conductivity type which includes a silicon compound layer causing a first stress in a gate length direction of a channel region in a first active region, and a stress insulating film which is formed on the first active region to cover a first gate electrode, a first sidewall, and the first source/drain region, and which causes a second stress opposite to the first stress. An uppermost surface of the silicon compound layer is located higher than a surface of a semiconductor substrate located directly under the first gate electrode. A first stress-relief film is formed in a space between the silicon compound layer and the first sidewall.

15 Claims, 10 Drawing Sheets

(52) U.S. Cl.
   CPC ............ *H01L 21/823842* (2013.01); *H01L 21/823864* (2013.01); *H01L 21/823878* (2013.01); *H01L 29/165* (2013.01); *H01L 29/6653* (2013.01); *H01L 29/6659* (2013.01); *H01L 29/66636* (2013.01); *H01L 29/7834* (2013.01); *H01L 29/7843* (2013.01); *H01L 29/7848* (2013.01); *H01L 29/665* (2013.01)
   USPC ..................................................... 257/368

(56) References Cited

U.S. PATENT DOCUMENTS

| | | | |
|---|---|---|---|
| 6,797,556 | B2 | 9/2004 | Murthy et al. |
| 2003/0040158 | A1 | 2/2003 | Saitoh |
| 2003/0080361 | A1 | 5/2003 | Murthy et al. |
| 2005/0218455 | A1 | 10/2005 | Maeda et al. |
| 2006/0186557 | A1 | 8/2006 | Shima et al. |
| 2008/0029834 | A1* | 2/2008 | Sell ............................ 257/411 |
| 2008/0064157 | A1 | 3/2008 | Maeda et al. |
| 2008/0099786 | A1* | 5/2008 | Maeda et al. ............... 257/190 |
| 2009/0026551 | A1 | 1/2009 | Nakagawa et al. |
| 2009/0065807 | A1* | 3/2009 | Fujimoto ...................... 257/190 |
| 2009/0267119 | A1 | 10/2009 | Tamura |
| 2011/0039379 | A1 | 2/2011 | Nakagawa et al. |
| 2011/0147852 | A1 | 6/2011 | Maeda et al. |

FOREIGN PATENT DOCUMENTS

| | | |
|---|---|---|
| JP | 2008124171 A | 5/2008 |
| JP | 2009-283527 | 12/2009 |
| JP | 2009-283586 | 12/2009 |

OTHER PUBLICATIONS

T. Ghani et al., "A 90nm High Volume Manufacturing Logic Technology Featuring Novel 45nm Gate Length Strained Silicon CMOS Transistors," IEDM Tech. Digest, pp. 978-980, 2003.

Z. Luo et al., "Design of High Performance PFETs with Strained Si Channel and Laser Anneal," IEDM Tech. Digest, pp. 495-498, 2005.

* cited by examiner

SEMICONDUCTOR DEVICE

CROSS-REFERENCE TO RELATED APPLICATION

This is a continuation of PCT International Application PCT/JP2010/005117 filed on Aug. 19, 2010, which claims priority to Japanese Patent Application No. 2010-002225 filed on Jan. 7, 2010. The disclosures of these applications including the specifications, the drawings, and the claims are hereby incorporated by reference in their entirety.

BACKGROUND

The present disclosure relates to semiconductor devices and methods for fabricating the semiconductor devices, and particularly relates to semiconductor devices which include a metal-insulator-semiconductor field-effect transistor (MISFET) having a source/drain region including a silicon compound layer, and methods for fabricating the semiconductor devices.

A distortion technique of enhancing the drive capability of a MISFET (hereinafter referred to as a "MIS transistor") by applying a stress to the channel region of the MIS transistor has been employed to improve the performance of a semiconductor integrated circuit device. In the case of p-type MIS transistors, it is known that if a compressive stress is applied to the channel region in the gate length direction, the mobility of carriers is increased, and the drive capability of the p-type MIS transistor is enhanced. Examples of methods for applying a compressive stress to the channel region in the gate length direction includes forming, in a source/drain region, a SiGe layer having a larger lattice constant than the lattice constant of a silicon substrate (see, e.g., Patent Document 1: U.S. Pat. No. 6,621,131 (U.S. Patent Publication No. 2003/0080361); Non-Patent Document 1: T. Ghani et al., "A 90 nm High Volume Manufacturing Logic Technology Featuring Novel 45 nm Gate Length Strained Silicon CMOS Transistors," IEDM Tech. Digest, pp. 978-980, 2003; and Non-Patent Document 2: Z. Luo et al., "Design of High Performance PFETs with Strained Si Channel and Laser Anneal," IEDM Tech. Digest, pp. 495-498, 2005).

A semiconductor device in which a p-type MIS transistor having a SiGe layer formed in a source/drain region, and an n-type MIS transistor are formed on the same semiconductor substrate will be described below, with reference to FIGS. 8A-8C, FIGS. 9A-9C, and FIGS. 10A-10C. FIG. 8A to FIG. 10C are cross-sectional views of a conventional semiconductor device in the gate length direction which sequentially show steps of fabricating the conventional semiconductor device. In FIG. 8A to FIG. 10C, the term "pMIS region" shown on the left side is a region where the p-type MIS transistor is formed, and the term "nMIS region" shown on the right side is a region where the n-type MIS transistor is formed.

Initially, as shown in FIG. 8A, an isolation region 101 is selectively formed in an upper portion of a semiconductor substrate 100. As a result, a first active region 100a surrounded by the isolation region 101 is formed in the pMIS region of the semiconductor substrate 100. A second active region 100b surrounded by the isolation region 101 is also formed in the nMIS region of the semiconductor substrate 100. After that, an n-type well region 102a is formed in the pMIS region of the semiconductor substrate 100, and a p-type well region 102b is formed in the nMIS region of the semiconductor substrate 100.

Next, first and second gate electrode formation portions 105A, 105B which respectively include first and second gate insulating films 103a, 103b, first and second gate electrodes 104a, 104b, and first and second protective insulating films 105a, 105b, are formed on the first and second active regions 100a, 100b.

Next, first and second offset spacers 106a, 106b are formed on side surfaces of the first and second gate electrode formation portions 105A, 105B. Then, p-type extension implantation regions 107a are formed in the first active region 100a on lateral sides of the first gate electrode formation portion 105A. Also, n-type extension implantation regions 107b are formed in the second active region 100b on lateral sides of the second gate electrode formation portion 105B.

Next, as shown in FIG. 8B, first and second sidewalls 109A, 109B which respectively include first and second inner sidewalls 108a, 108b, and first and second outer sidewalls 109a, 109b, are formed on the side surfaces of the first and second gate electrode formation portions 105A, 105B, with the first and second offset spacers 106a, 106b interposed between the first and second gate electrode formation portions 105A, 105B and the first and second sidewalls 109A, 109B.

Next, as shown in FIG. 8C, a protective insulating film 110 which covers the second gate electrode formation portion 105B, the second offset spacer 106b, the second sidewall 109B, and the n-type extension implantation region 107b is formed on the second active region 100b.

Next, the first active region 100a is etched using the first sidewall 109A and the protective insulating film 110 as a mask. As a result, trenches 111 are formed in the first active region 100a on lateral sides of the first sidewall 109A.

Next, as shown in FIG. 9A, a SiGe layer 112 doped with a p-type impurity is formed in each of the trenches 111. Since the SiGe layer 112 is doped with the p-type impurity, the region of the SiGe layer 112 is a p-type impurity-introduced region.

Next, as shown in FIG. 9B, the protective insulating film 110 and the first and second protective insulating films 105a, 105b are removed.

Next, as shown in FIG. 9C, n-type source/drain injection regions 113 are formed in the second active region 100b on lateral sides of the second sidewall 109B.

Next, as shown in FIG. 10A, the p-type and n-type impurities contained in the p-type and n-type extension implantation regions 107a, 107b are activated by a thermal treatment to form p-type and n-type extension regions 114a, 114b. The p-type impurity contained in the region of the SiGe layer 112 (i.e., the p-type impurity-introduced region) is activated to form a p-type source/drain region 115a. The n-type impurity contained in the n-type source/drain injection region 113 is activated to form an n-type source/drain region 115b.

Next, as shown in FIG. 10B, first and third silicide layers 116a, 116b are formed on the first and second gate electrodes 104a, 104b, and second and fourth silicide layers 117a, 117b are formed on the p-type and n-type source/drain regions 115a, 115b.

Next, as shown in FIG. 10C, a stress insulating film 118 which causes a tensile stress in the gate length direction of the channel region in the second active region 100b is formed on the entire surface of the semiconductor substrate 100.

Conventional semiconductor devices are formed in this manner.

SUMMARY

However, the conventional semiconductor devices have the following problem.

In general, if a tensile stress is applied to the channel region of the active region in the gate length direction, the drive capability of the n-type MIS transistor is enhanced, but the drive capability of the p-type MIS transistor is reduced.

In conventional semiconductor devices, it is possible to improve the drive capability of the n-type MIS transistor by using the stress insulating film 118 to apply a tensile stress to the channel region of the second active region 100b in the gate length direction. However, due to the stress insulating film 118, a tensile stress is applied to the channel region of the first active region 100a in the gate length direction. Thus, the drive capability of the p-type MIS transistor may be reduced.

In view of the above problem, an objective of the present disclosure is to prevent a reduction in drive capability of a MIS transistor due to a stress insulating film, in a semiconductor device which includes a MIS transistor having a source/drain region including a silicon compound layer.

To achieve the above objective, a semiconductor device according to one embodiment of the present disclosure includes a first MIS transistor, wherein the first MIS transistor includes: a first gate insulating film formed on a first active region in a semiconductor substrate; a first gate electrode formed on the first gate insulating film; a first sidewall formed on a side surface of the first gate electrode; a first source/drain region of a first conductivity type which is formed in a trench provided in the first active region on a lateral side of the first sidewall, and which includes a silicon compound layer causing a first stress in a gate length direction of a channel region in the first active region; and a stress insulating film which is formed on the first active region to cover the first gate electrode, the first sidewall, and the first source/drain region, and which causes a second stress opposite to the first stress, an uppermost surface of the silicon compound layer is located higher than a surface of the semiconductor substrate located directly under the first gate electrode, and a first stress-relief film is formed in a space between the silicon compound layer and the first sidewall.

In the semiconductor device according to one embodiment of the present disclosure, the uppermost surface of the silicon compound layer is located higher than the surface of the semiconductor substrate located directly under the first gate electrode. In other words, the silicon compound layer includes a portion in the trench, and a protruding portion located on the portion in the trench. Thus, a space is formed between the silicon compound layer and the first sidewall, and the first stress-relief film can be formed in the space. Accordingly, the protruding portion of the silicon compound layer and the first stress-relief film can be interposed between the stress insulating film and the channel region in the first active region. This means that the stress insulating film can be separated from the channel region in the first active region by the thicknesses of the protruding portion of the silicon compound layer and the first stress-relief film. In this structure, it is possible to reduce the second stress applied from the stress insulating film to the channel region in the first active region in the gate length direction. As a result, it is possible to prevent a reduction in drive capability of the first MIS transistor due to a decrease in the mobility of electrons.

Further, the first stress from the silicon compound layer can be applied to the channel region in the first active region in the gate length direction. It is therefore possible to improve the drive capability of the first MIS transistor. Moreover, as described above, the silicon compound layer includes the portion in the trench, and the protruding portion located on the portion in the trench. Thus, the thickness of the silicon compound layer can be increased by the thickness of the protruding portion of the silicon compound layer. Therefore, the first stress can be efficiently applied to the channel region in the first active region in the gate length direction. Consequently, it is possible to further improve the drive capability of the first MIS transistor.

It is preferable that the semiconductor device according to one embodiment of the present disclosure further includes a first offset spacer which is formed between the first gate electrode and the first sidewall, and whose cross-section has an I shape.

It is preferable that the semiconductor device according to one embodiment of the present disclosure further includes a first silicide layer formed on the first gate electrode; and a second silicide layer formed on the first source/drain region which includes the silicon compound layer.

In the semiconductor device according to one embodiment of the present disclosure, the first stress-relief film is preferably formed on a side surface of the silicon compound layer.

In the semiconductor device according to one embodiment of the present disclosure, the first sidewall preferably includes an inner sidewall which is formed on the side surface of the first gate electrode, and whose cross-section has an L shape, and an outer sidewall formed on the inner sidewall.

In the semiconductor device according to one embodiment of the present disclosure, it is preferable that the first sidewall includes an inner sidewall whose cross-section has an L shape, and the stress insulating film is formed in contact with a surface of the inner sidewall which is curved to have an L-shaped cross-section.

In the semiconductor device according to one embodiment of the present disclosure, it is preferable that the first MIS transistor is a p-type MIS transistor, the first stress is a compressive stress, and the second stress is a tensile stress.

In the semiconductor device according to one embodiment of the present disclosure, it is preferable that the silicon compound layer is a SiGe layer, the stress insulating film is a silicon nitride film, and the first stress-relief film is a silicon oxide film.

In the semiconductor device according to one embodiment of the present disclosure, it is preferable that the first MIS transistor is an n-type MIS transistor, the first stress is a tensile stress, and the second stress is a compressive stress.

It is preferable that the semiconductor device according to one embodiment of the present disclosure includes: an isolation region formed in the semiconductor substrate to surround the first active region; a gate interconnect formed on the isolation region; an interconnect sidewall formed on a side surface of the gate interconnect; a second stress-relief film formed on a side surface of a recessed portion provided in the isolation region on a lateral side of the interconnect sidewall; and the stress insulating film formed on the isolation region to cover the gate interconnect, the interconnect sidewall, and the second stress-relief film.

It is preferable that the semiconductor device according to one embodiment of the present disclosure further includes a second MIS transistor, wherein the second MIS transistor includes a second gate insulating film formed on a second active region in the semiconductor substrate, a second gate electrode formed on the second gate insulating film, a second sidewall formed on a side surface of the second gate electrode, a second source/drain region of a second conductivity type which is formed in the second active region on a lateral side of the second sidewall, and the stress insulating film formed on the second active region to cover the second gate electrode, the second sidewall, and the second source/drain region.

According to this method, the second stress from the stress insulating film can be applied to the channel region in the second active region in the gate length direction. It is therefore possible to increase the mobility of electrons, and improve the drive capability of the second MIS transistor.

In the semiconductor device according to one embodiment of the present disclosure, no first stress-relief film is preferably formed on the second active region.

It is preferable that the semiconductor device according to one embodiment of the present disclosure further includes a third MIS transistor, wherein the third MIS transistor includes a third gate insulating film formed on a third active region in the semiconductor substrate, a third gate electrode formed on the third gate insulating film, a third sidewall formed on a side surface of the third gate electrode, a third source/drain region of a first conductivity type which is formed in the third active region on a lateral side of the third sidewall, a protective film formed on the third active region to cover the third gate electrode, the third sidewall, and the third source/drain region, and the stress insulating film formed on the protective film.

In this structure, the protective film is formed on the third active region to cover the third gate electrode, the third sidewall, and the third source/drain region. Thus, the protective film can be interposed between the stress insulating film and the channel region in the third active region. This means that the stress insulating film can be separated from the channel region in the third active region by the thickness of the protective film. In this structure, it is possible to reduce the second stress applied from the stress insulating film to the channel region in the third active region in the gate length direction. As a result, it is possible to prevent a reduction in drive capability of the third MIS transistor due to a decrease in the mobility of electrons.

In the semiconductor device according to one embodiment of the present disclosure, no silicide layer is preferably formed on the third gate electrode and the third source/drain region.

In the semiconductor device according to one embodiment of the present disclosure, the first stress-relief film and the protective film are preferably made of a same insulating material.

To achieve the above objective, a method for fabricating a semiconductor device according to one aspect of the present disclosure is a method for fabricating a semiconductor device having a first MIS transistor formed on a first active region in a semiconductor substrate, the method including the steps of: (a) forming, on the first active region, a first gate electrode formation portion including a first gate insulating film and a first gate electrode; (b), after step (a), forming a first sidewall on a side surface of the first gate electrode formation portion; (c), after step (b), forming a trench in the first active region on a lateral side of the first sidewall, and thereafter forming, in the trench, a first source/drain region of a first conductivity type which includes a silicon compound layer causing a first stress in a gate length direction of a channel region in the first active region; (d), after step (c), forming a first stress-relief film in a space between the silicon compound layer and the first sidewall; and (e), after step (d), forming, on the first active region, a stress insulating film which covers the first gate electrode, the first sidewall, the first source/drain region, and the first stress-relief film, and which causes a second stress opposite to the first stress.

According to the method for fabricating the semiconductor device according to one aspect of the present disclosure, an uppermost surface of the silicon compound layer is located higher than a surface of the semiconductor substrate located directly under the first gate electrode. In other words, the silicon compound layer includes a portion in the trench, and a protruding portion located on the portion in the trench. Thus, a space is formed between the silicon compound layer and the first sidewall, and the first stress-relief film can be formed in the space. Accordingly, the protruding portion of the silicon compound layer and the first stress-relief film can be interposed between the stress insulating film and the channel region in the first active region. This means that the stress insulating film can be separated from the channel region in the first active region by the thicknesses of the protruding portion of the silicon compound layer and the first stress-relief film. In this structure, it is possible to reduce the second stress applied from the stress insulating film to the channel region in the first active region in the gate length direction. As a result, it is possible to prevent a reduction in drive capability of the first MIS transistor due to a decrease in the mobility of electrons.

Further, the first stress from the silicon compound layer can be applied to the channel region in the first active region in the gate length direction. It is therefore possible to improve the drive capability of the first MIS transistor. Moreover, as described above, the silicon compound layer includes the portion in the trench, and the protruding portion located on the portion in the trench. Thus, the thickness of the silicon compound layer can be increased by the thickness of the protruding portion of the silicon compound layer. Therefore, the first stress can be efficiently applied to the channel region in the first active region in the gate length direction. Consequently, it is possible to further improve the drive capability of the first MIS transistor.

In the method for fabricating the semiconductor device according to one aspect of the present disclosure, it is preferable that an uppermost surface of the silicon compound layer is located higher than a surface of the semiconductor substrate located directly under the first gate electrode in step (c).

Preferably, the method for fabricating the semiconductor device according to one aspect of the present disclosure further includes, before step (a), the step of (f) forming an isolation region in the semiconductor substrate to surround the first active region, wherein (a) includes forming, on the isolation region, a gate interconnect formation portion having a gate interconnect; (b) includes forming an interconnect sidewall on a side surface of the gate interconnect formation portion; (d) includes forming a second stress-relief film on a side surface of a recessed portion formed in the isolation region on a lateral side of the interconnect sidewall; and (e) includes forming the stress insulating film on the isolation region to cover the gate interconnect, the interconnect sidewall and the second stress-relief film.

In the method for fabricating the semiconductor device according to one aspect of the present disclosure, it is preferable that the semiconductor device includes a second MIS transistor formed on a second active region in the semiconductor substrate; (a) includes forming, on the second active region, a second gate electrode formation portion including a second gate insulating film and a second gate electrode; (b) includes forming a second sidewall on a side surface of the second gate electrode formation portion; the method further includes, after (c) and before (d), a step of (g) forming a second source/drain region of a second conductivity type in the second active region on a lateral side of the second sidewall; and (e) includes forming the stress insulating film on the second active region to cover the second gate electrode, the second sidewall and the second source/drain region.

According to this method, the second stress from the stress insulating film can be applied to the channel region in the second active region in the gate length direction. It is therefore possible to increase the mobility of electrons, and therefore improve the drive capability of the second MIS transistor.

In the method for fabricating the semiconductor device according to one aspect of the present disclosure, it is preferable that the semiconductor device includes a third MIS transistor formed on a third active region in the semiconductor substrate; (a) includes forming, on the third active region, a third gate electrode formation portion including a third gate insulating film and a third gate electrode; (b) includes forming a third sidewall on a side surface of the third gate electrode formation portion; the method further includes, after (c) and before (d), a step of (h) forming a third source/drain region of a first conductivity type in the third active region on a lateral side of the third sidewall; (d) includes forming a protective film on the third active region to cover the third gate electrode, the third sidewall, and the third source/drain region; and (e) includes forming the stress insulating film on the protective film.

According to this method, the protective film is formed on the third active region to cover the third gate electrode, the third sidewall, and the third source/drain region. Thus, the protective film can be interposed between the stress insulating film and the channel region in the third active region. This means that the stress insulating film can be separated from the channel region in the third active region by the thickness of the protective film. In this structure, it is possible to reduce the second stress applied from the stress insulating film to the channel region in the third active region in the gate length direction. As a result, it is possible to prevent a reduction in drive capability of the third MIS transistor due to a decrease in the mobility of electrons.

In a semiconductor device according to one embodiment of the present disclosure and a method for fabricating the semiconductor device, the uppermost surface of the silicon compound layer is located higher than the surface of the semiconductor substrate located directly under the first gate electrode. In other words, the silicon compound layer includes a portion in the trench, and a protruding portion located on the portion in the trench. Thus, a space is formed between the silicon compound layer and the first sidewall, and the first stress-relief film can be formed in the space. Accordingly, the protruding portion of the silicon compound layer and the first stress-relief film can be interposed between the stress insulating film and the channel region in the first active region. This means that the stress insulating film can be separated from the channel region in the first active region by the thicknesses of the protruding portion of the silicon compound layer and the first stress-relief film. In this structure, it is possible to reduce the second stress applied from the stress insulating film to the channel region in the first active region in the gate length direction. As a result, it is possible to prevent a reduction in drive capability of the first MIS transistor due to a decrease in the mobility of electrons.

DETAILED DESCRIPTION

An embodiment of the present disclosure will be described with reference to the drawings.

One Embodiment

A method for fabricating a semiconductor device according to one embodiment of the present disclosure will be described below with reference to FIGS. 1A-1B, 2A-2B, 3A-3B, 4A-4B, 5A-5B, and 6A-6B. FIGS. 1A-6B are cross-sectional views of the semiconductor device according to one embodiment of the present disclosure in the gate length direction which sequentially show steps of fabricating the semiconductor device. In FIGS. 1A-6B, a first pMIS region, an interconnect region, an nMIS region, and a second pMIS region are shown from the left. The term "first pMIS region" refers to a region where a first MIS transistor is formed. The term "interconnect region" refers to a region where a gate interconnect is formed. The term "nMIS region" refers to a region where a second MIS transistor is formed. The term "second pMIS region" refers to a region where a third MIS transistor is formed. The term "first MIS transistor" refers to a MIS transistor which has a source/drain region including a silicon compound layer. The first MIS transistor is used, for example, for a logic circuit or an internal circuit. The term "third MIS transistor" refers to an MIS transistor which does not have a silicide layer formed on a source/drain region. The third MIS transistor is used, for example, for an analog circuit or a peripheral circuit.

Figure 1A:
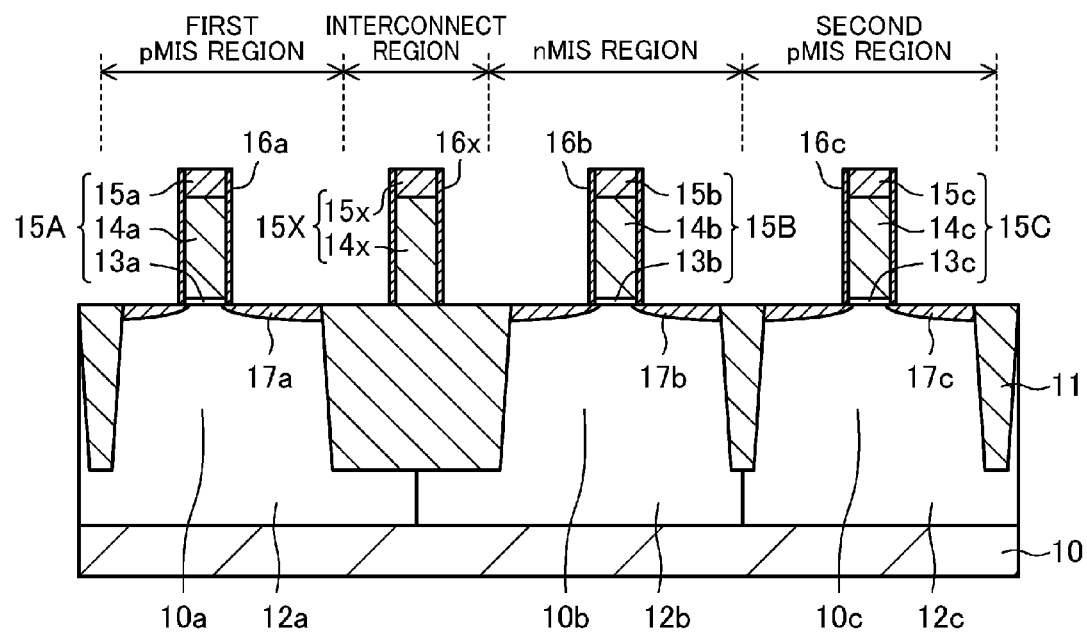
FIGS. 1A-1B are cross-sectional views of a semiconductor device according to one embodiment of the present disclosure in the gate length direction which sequentially show steps of fabricating the semiconductor device.

Initially, as shown in FIG. 1A, an isolation region 11 made, for example, of a silicon oxide film is selectively formed in an upper portion of the semiconductor substrate 10 made, for example, of a p-type silicon by, for example, a shallow trench isolation (STI) process. As a result, first and third active regions 10a, 10c surrounded by the isolation region 11 are formed in the first and second pMIS regions of the semiconductor substrate 10, respectively. A second active region 10b surrounded by the isolation region 11 is also formed in the nMIS region of the semiconductor substrate 10.

Then, an n-type impurity, such as phosphorus (P), etc., is implanted into the first and second pMIS regions of the semiconductor substrate 10 by an ion implantation process. On the other hand, a p-type impurity, such as boron (B), etc., is implanted into the nMIS region of the semiconductor substrate 10 by an ion implantation process. After that, a thermal treatment is performed to form first and second n-type well regions 12a, 12c in the first and second pMIS regions of the semiconductor substrate 10. A p-type well region 12b is also formed in the nMIS region of the semiconductor substrate 10.

Next, a gate insulating film formation film made, for example, of a silicon oxide film having a thickness of 1.8 nm is deposited on the first, second, and third active regions 10a, 10b, 10c by, for example, an in-situ steam generation (ISSG) process. Then, a gate electrode formation film made, for example, of a polysilicon film having a thickness of 50 nm is deposited on the gate insulating film formation film by, for example, a chemical vapor deposition (CVD) process. Next, a protective insulating film formation film made, for example, of a silicon oxide film having a thickness of 30 nm is deposited on the gate electrode formation film by, for example, a CVD process. Then, a resist pattern (not shown) is formed on the protective insulating film formation film by a lithography process. After that, the protective insulating film formation film, the gate electrode formation film, and the gate insulating film formation film are successively patterned by a dry etching process using the resist pattern as a mask. As a result, first, second and third gate electrode formation portions 15A, 15b, 15c which include first, second and third gate insulating films 13a, 13b, 13c, the first, second and third gate electrodes 14a, 14b, 14c, and the first, second and third protective insulating films 15a, 15b, 15c, respectively, are formed on the first, second and third active regions 10a, 10b, 10c, respectively. A gate interconnect formation portion 15X which includes a gate interconnect 14x and a protective insulating film 15x for interconnect, is also formed on the isolation region 11 located between the first active region 10a and the second active region 10b.

Next, an offset spacer film made, for example, of a silicon nitride film having a thickness of 5 nm is deposited on the entire surface of the semiconductor substrate 10 by, for example, a CVD process. Then, the offset spacer film is subjected to anisotropic dry etching, for example. As a result, first, second and third offset spacers 16a, 16b, 16c whose cross-sections have an I shape are formed on side surfaces of the first, second and third gate electrode formation portions 15A, 15B, 15C. An offset spacer 16x for interconnect whose cross-section has an I shape is also formed on the side surface of the gate interconnect formation portion 15X.

After that, a p-type impurity, such as B, etc., is implanted into the first active region 10a in a first implantation dose amount by an ion implantation process using the first gate electrode formation portion 15A as a mask. As a result, first p-type extension implantation regions 17a are formed in a self-aligning manner in the first active region 10a on lateral sides of the first gate electrode formation portion 15A. Then, an n-type impurity, such as arsenic (As), etc., is implanted into the second active region 10b by an ion implantation process using the second gate electrode formation portion 15B as a mask. As a result, n-type extension implantation regions 17b are formed in a self-aligning manner in the second active region 10b on lateral sides of the second gate electrode formation portion 15B. After that, a p-type impurity, such as B, etc., is implanted into the third active region 10c in a second implantation dose amount less than the first implantation dose amount, by an ion implantation process using the third gate electrode formation portion 15C as a mask. As a result, second p-type extension implantation regions 17c are formed in a self-aligning manner in the third active region 10c on lateral sides of the gate electrode formation portion 15C. Here, since the second implantation dose amount is less than the first implantation dose amount, the p-type impurity concentration of the second p-type extension implantation region 17c is lower than the p-type impurity concentration of the first p-type extension implantation region 17a. The order of formation of the first and second p-type extension implantation regions 17a, 17c and the n-type extension implantation region 17b is not decided.

Figure 1B:
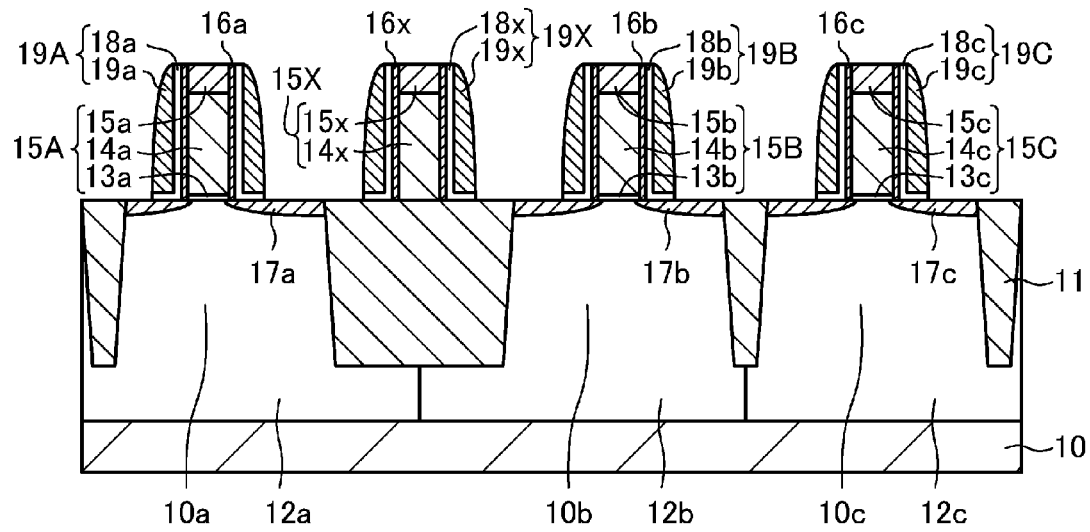

Next, as shown in FIG. 1B, an inner sidewall film made, for example, of a silicon oxide film having a thickness of 5 nm, and an outer sidewall film made, for example, of a silicon nitride film having a thickness of 15 nm are successively deposited on the entire surface of the semiconductor substrate 10 by, for example, a CVD process. Then, the outer sidewall film and the inner sidewall film are successively subjected to anisotropic etching, for example. As a result, first, second and third sidewalls 19A, 19B, 19C which respectively include first, second and third inner sidewalls 18a, 18b, 18c whose cross-sections have an L shape, and first, second and third outer sidewalls 19a, 19b, 19c, are respectively formed on the side surfaces of the first, second and third gate electrode formation portions 15A, 15B, 15C, with the first, second and third offset spacers 16a, 16b, 16c interposed between the first, second and third gate electrode formation portions 15A, 15B, 15C and the first, second and third sidewalls 19A, 19B, 19C. A sidewall 19X for interconnect which includes an inner sidewall 18x for interconnect whose cross-section has an L shape, and an outer sidewall 19x for interconnect, is also formed on the side surface of the gate interconnect formation portion 15X, with the offset spacer 16x for interconnect interposed between the gate interconnect formation portion 15X and the sidewall 19X for interconnect.

Figure 2A:
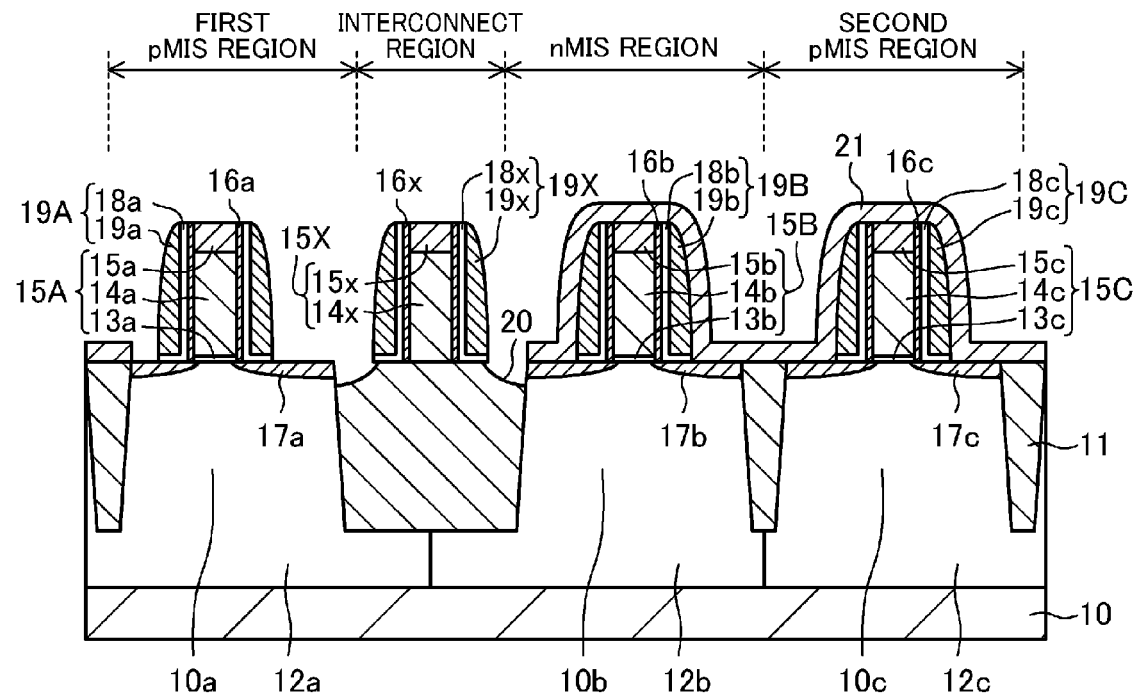
FIGS. 2A-2B are cross-sectional views of the semiconductor device according to one embodiment of the present disclosure in the gate length direction which sequentially show steps of fabricating the semiconductor device.

Next, as shown in FIG. 2A, a protective insulating film formation film made, for example, of a silicon oxide film having a thickness of 10 nm is formed on the entire surface of the semiconductor substrate 10 by, for example, a CVD process. Then, a resist pattern (not shown) which does not cover the first pMIS region and the interconnect region, and covers the nMIS region and the second pMIS region, is formed on the protective insulating film formation film by a lithography process. After that, the protective insulating film formation film in the first pMIS region and the interconnect region is removed by etching using the resist pattern as a mask. As a result, the surfaces of first active region 10a located on lateral sides of the first sidewall 19A are exposed. Further, a protective insulating film 21 is formed on the second and third active regions 10b, 10c to cover the second and third gate electrode formation portions 15B, 15C, the second and third offset spacers 16b, 16c, the second and third sidewalls 19B, 19C, the n-type extension implantation region 17b and the second p-type extension implantation region 17c. After that, the resist pattern is removed.

The isolation region 11 (a silicon oxide film) is etched at this time. Thus, as shown in FIG. 2A, a recessed portion 20 is formed in the isolation region 11 on a lateral side of the sidewall 19X for interconnect.

Figure 2B:
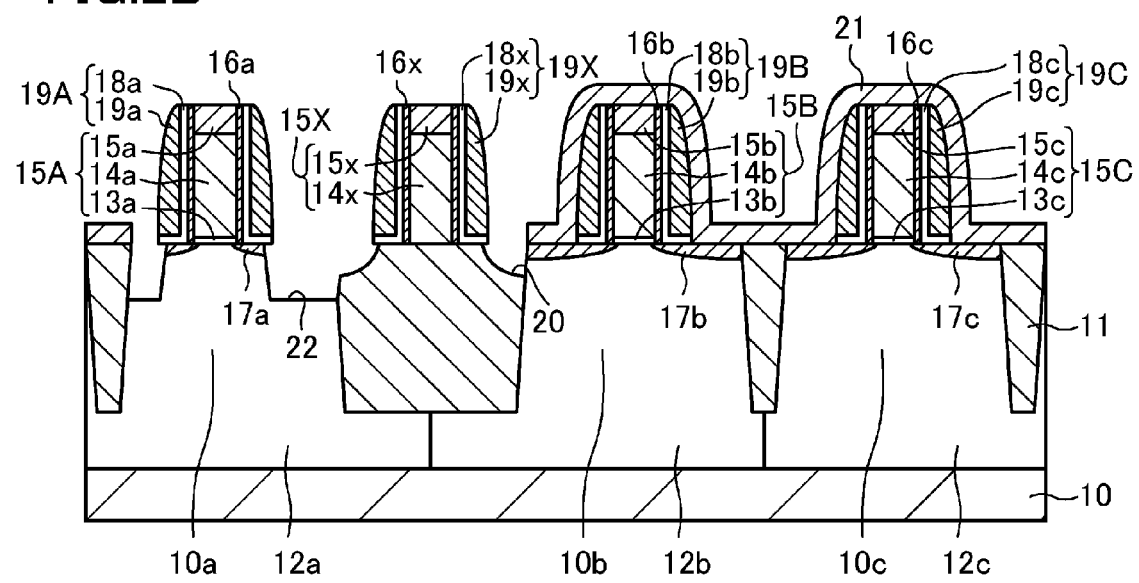

Next, as shown in FIG. 2B, the first active region 10a is subjected to, for example, dry etching using the first sidewall 19A and the protective insulating film 21 as a mask. As a result, a trench 22 having a depth, for example, of 60 nm is formed in the first active region 10a on a lateral side of the first sidewall 19A.

The isolation region 11 (a silicon oxide film) is etched at this time. As a result, as shown in FIG. 2B, a recessed portion 20 is formed in the isolation region 11 on a lateral side of the sidewall 19X for interconnect. The depth of the recessed portion 20 shown in FIG. 2B is greater than the depth of the recessed portion 20 shown in FIG. 2A.

Figure 3A:
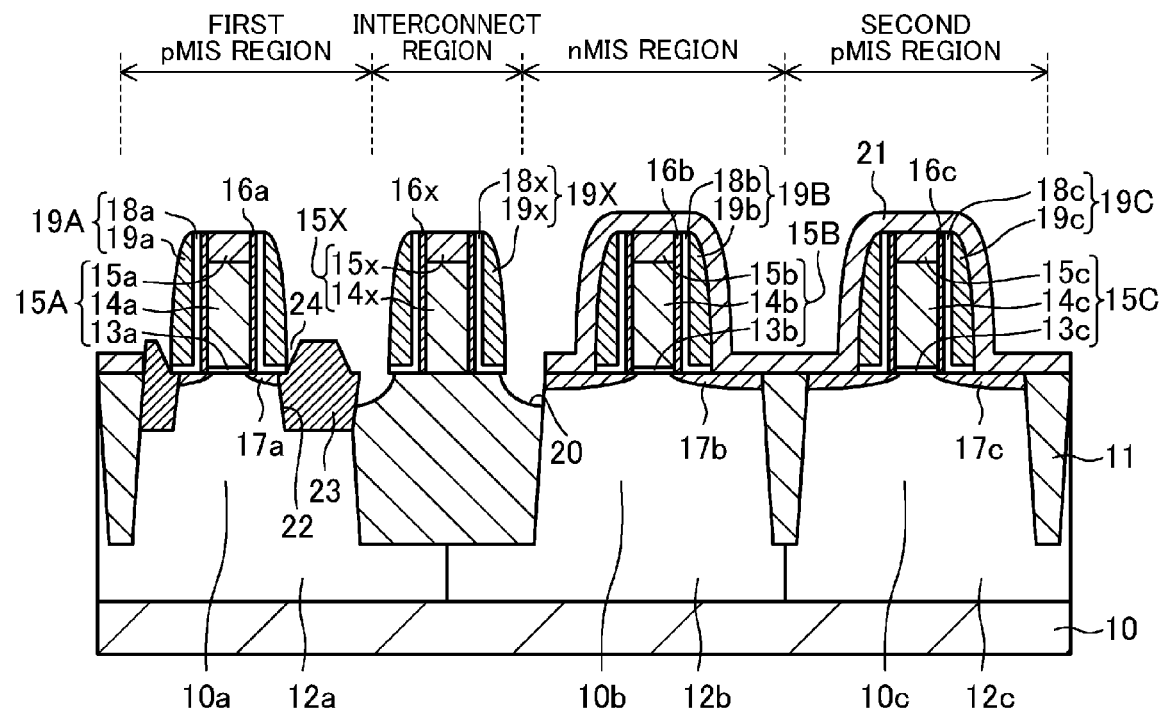
FIGS. 3A-3B are cross-sectional views of the semiconductor device according to one embodiment of the present disclosure in the gate length direction which sequentially show steps of fabricating the semiconductor device.

Next, as shown in FIG. 3A, a silane gas ($SiH_4$ gas) and a germane gas ($GeH_4$ gas), for example, are supplied along with a p-type impurity gas, such as a diborane gas ($B_2H_6$ gas) etc., by, for example, a CVD process. As a result, a silicon compound layer 23 made, for example, of SiGe having a thickness of 90 nm is formed in the trench 22. Since the silicon compound layer 23 is doped with a p-type impurity such as B, etc., the region of the silicon compound layer 23 is a p-type impurity-introduced region. The p-type impurity concentration of the silicon compound layer 23 is, for example, $1 \times 10^{20}$ $cm^2$. The silicon compound layer 23 causes a compressive stress in the gate length direction of the channel region in the first active region 10a.

Here, the height of the uppermost surface of the silicon compound layer 23 is higher than the surface of the semiconductor substrate 10 located directly under the first gate electrode 14a. As a result, a space 24 is formed between the silicon compound layer 23 and the first sidewall 19A.

Further, the silicon compound layer 23 is grown such that the germanium concentration and the p-type impurity concentration are gradually increased. This makes it possible to lower the germanium concentration and the p-type impurity concentration of part of the silicon compound layer 23 which is in contact with the semiconductor substrate 10. Therefore, it is possible to reduce the difference between the lattice constant of the part of the silicon compound layer 23 which is in contact with the semiconductor substrate 10, and the lattice constant of the semiconductor substrate 10. As a result, crystal defects can be avoided. In other words, it is possible to avoid the crystal defects caused by forming a silicon compound layer whose lattice constant is significantly different from the lattice constant of the semiconductor substrate 10 (i.e., a silicon compound layer whose germanium concentration and p-type impurity concentration are high) on the semiconductor substrate 10 that is exposed in the trench 22. Further, it is possible to prevent the p-type impurity from being diffused into the vicinity of the silicon compound layer, and causing an adverse effect on the performance of the MIS transistor.

Further, since the upper surface of the first gate electrode 14a is covered by first protective insulating film 15a, no SiGe layer is formed on the first gate electrode 14a. Since the upper surface of the gate interconnect 14x is covered by the protective insulating film 15x for interconnect, no SiGe layer is formed on the gate interconnect 14x. Since the upper surfaces of the second and third gate electrodes 14b, 14c are successively covered by the second and third protective insulating films 15b, 15c, respectively, and the protective insulating film 21, no SiGe layer is formed on the second and third gate electrodes 14b, 14c. Since the surfaces of the second and third active regions 10b, 10c are covered by the protective insulating film 21, no SiGe layer is formed on the second and third active regions 10b, 10c.

Figure 3B:
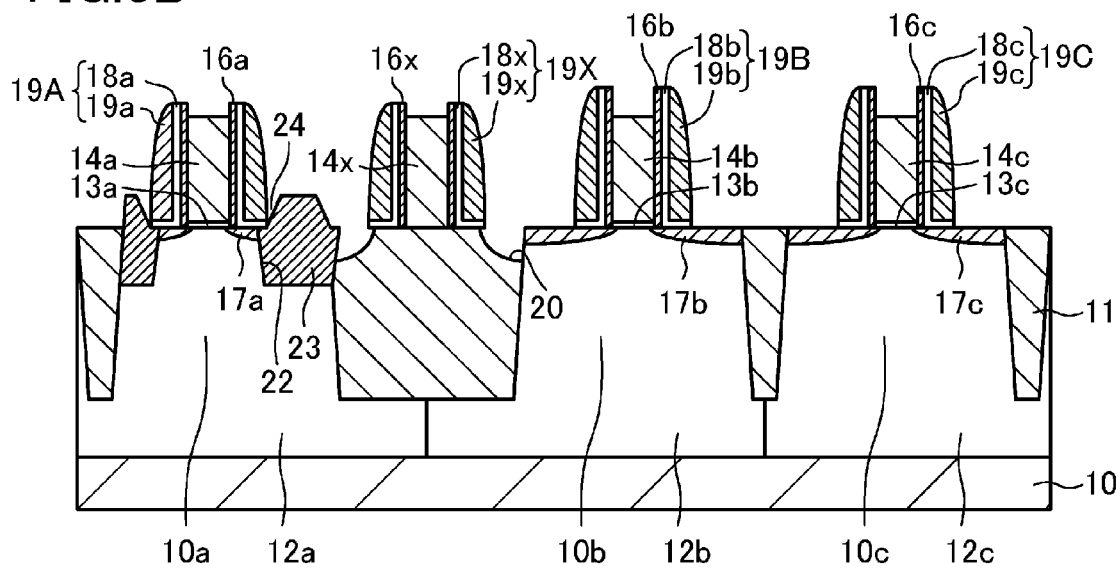

Next, as shown in FIG. 3B, the protective insulating film 21, the first, second and third protective insulating films 15a, 15b, 15c, and the protective insulating film 15x for interconnect are removed by, for example, wet etching. As a result, the surfaces of the n-type extension implantation region 17b and the second p-type extension implantation region 17c, and the upper surfaces of the first, second and third gate electrodes 14a, 14b, 14c and the gate interconnect 14x are exposed.

Here, as shown in FIG. 3A, the top ends of the first offset spacer 16a, the offset spacer 16x for interconnect, the first inner sidewall 18a, and the inner sidewall 18x for interconnect before etching are exposed. On the other hand, the top ends of the second and third offset spacers 16b, 16c and the second and third inner sidewalls 18b, 18c before etching are covered by the protective insulating film 21. Thus, the first offset spacer 16a and the offset spacer 16x for interconnect are subjected to the etching for a longer time than the second and third offset spacers 16b, 16c. Consequently, as shown in FIG. 3B, the heights of the top ends of the first offset spacer 16a and the offset spacer 16x for interconnect after etching are lower than the heights of the top ends of the second and third offset spacers 16b, 16c. Similarly, the first inner sidewall 18a and the inner sidewall 18x for interconnect are subjected to the etching for a longer time than the second and third inner sidewalls 18b, 18c. Consequently, as shown in FIG. 3B, the heights of the top ends of the first inner sidewall 18a and the inner sidewall 18x for interconnect after etching are lower than the heights of the top ends of the second and third inner sidewalls 18b, 18c. Here, the "height of the top end" of the offset spacer or the inner sidewall refers to the height from the surface of the semiconductor substrate located directly under the gate electrode (or the gate interconnect) to the top end of the offset spacer or the inner sidewall.

Figure 4A:
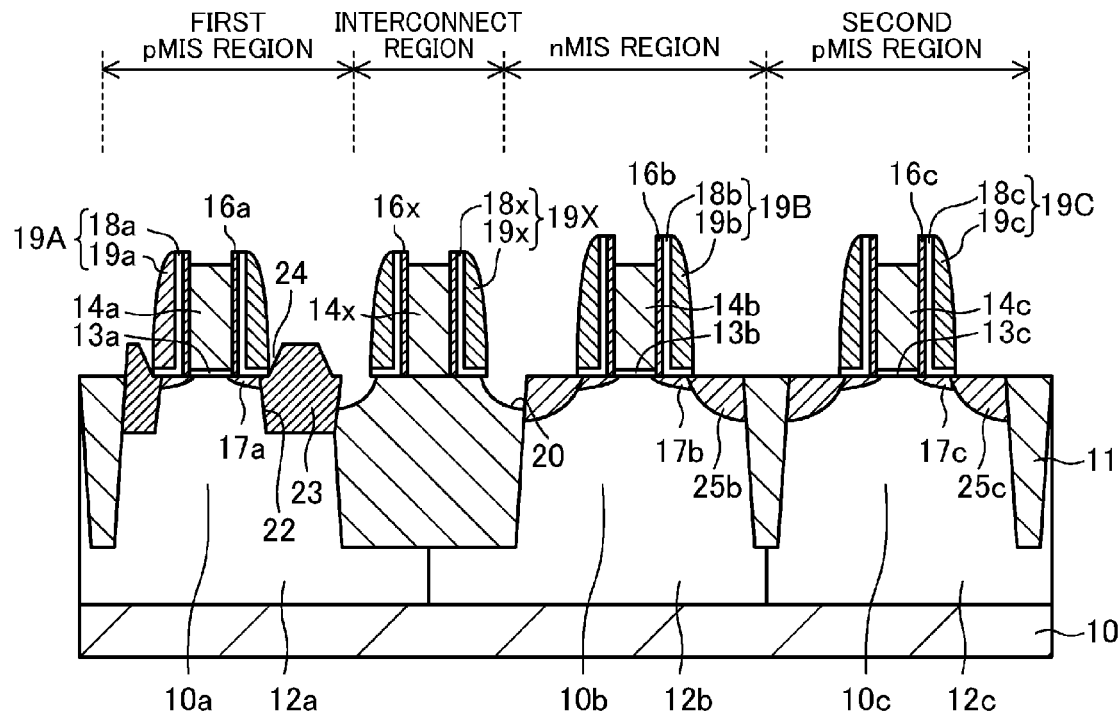
FIGS. 4A-4B are cross-sectional views of the semiconductor device according to one embodiment of the present disclosure in the gate length direction which sequentially show steps of fabricating the semiconductor device.

Next, as shown in FIG. 4A, an n-type impurity, such as As, etc., is implanted into the second active region 10b by an ion implantation process using the second gate electrode 14b and the second sidewall 19B as a mask. As a result, n-type source/drain injection regions 25b are formed in a self-aligning manner in the second active region 10b on lateral sides of the second sidewall 19B. On the other hand, a p-type impurity, such as B, etc., is implanted into the third active region 10c by an ion implantation process using the third gate electrode 14c and the third sidewall 19C as a mask. As a result, p-type source/drain injection regions 25c are formed in a self-aligning manner in the third active region 10c on lateral sides of the third sidewall 19C.

Figure 4B:
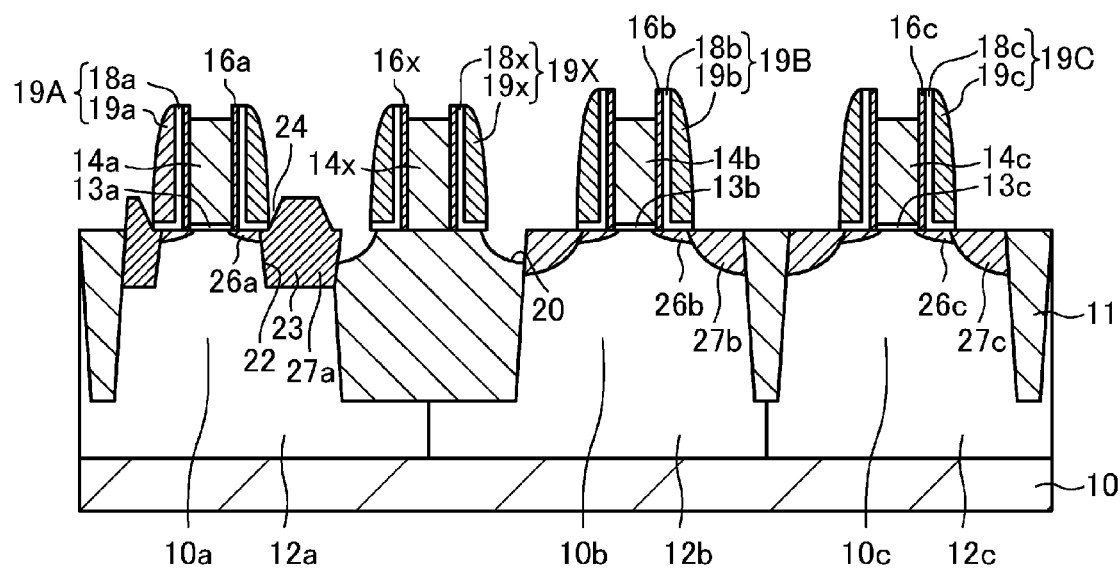

Next, as shown in FIG. 4B, a thermal treatment is performed for one second at 950° C., for example.

The p-type impurity contained in the first and second p-type extension implantation regions 17a, 17c is activated by the thermal treatment. As a result, first and second p-type extension regions 26a, 26c are formed. The n-type impurity contained in the n-type extension implantation region 17b is activated to form an n-type extension region 26b.

The p-type impurity contained in the region of the silicon compound layer 23 (i.e., the p-type impurity-introduced region) is activated by the thermal treatment to form a first p-type source/drain region 27a including the silicon compound layer 23. The n-type impurity contained in the n-type source/drain injection region 25b is activated to form an n-type source/drain region 27b. The p-type impurity contained in the p-type source/drain injection region 25c is activated to form a second p-type source/drain region 27c.

Figure 5A:
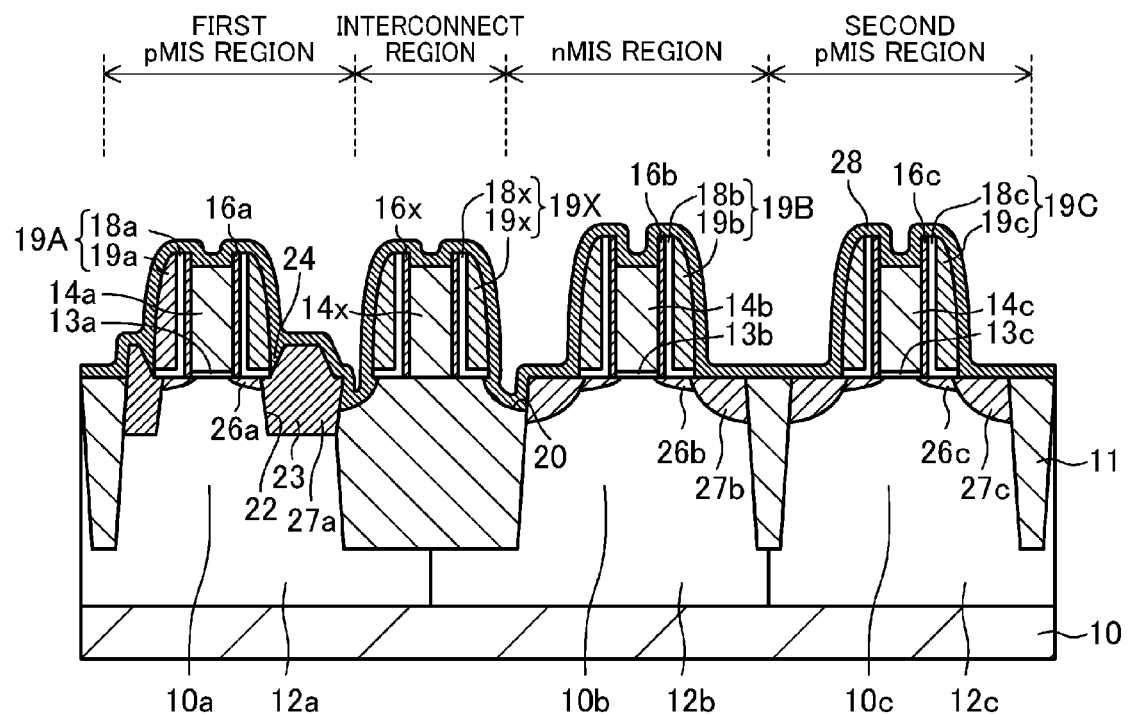
FIGS. 5A-5B are cross-sectional views of the semiconductor device according to one embodiment of the present disclosure in the gate length direction which sequentially show steps of fabricating the semiconductor device.

Next, as shown in FIG. 5A, an insulating film 28 made, for example, of a silicon oxide film having a thickness of 16 nm is deposited on the entire surface of the semiconductor substrate 10 by, for example, a CVD process.

Figure 5B:
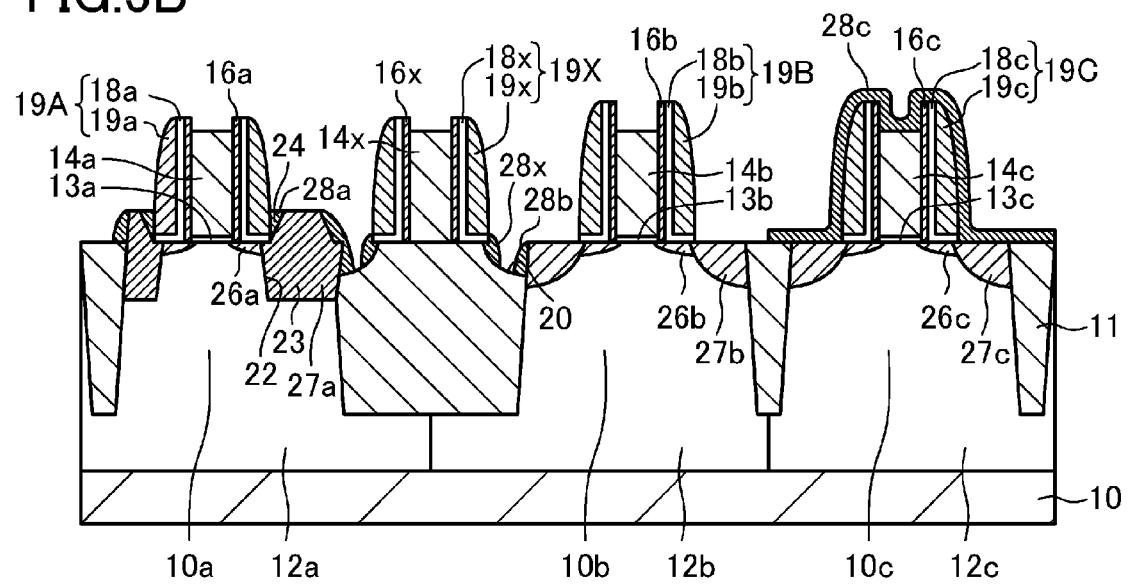

Next, as shown in FIG. 5B, a resist pattern (not shown) which does not cover the first pMIS region, the interconnect region, and the nMIS region, and covers the second pMIS region, is formed on the insulating film 28 by a lithography process. After that, the insulating film 28 is subjected to, for example, an anisotropic dry etching and a wet etching successively, using the resist pattern as a mask. As a result, the upper surfaces of the first and second gate electrodes 14a, 14b and the gate interconnect 14x, and the surfaces of the first p-type source/drain region 27a and the n-type source/drain region 27b are exposed. On the other hand, a first stress-relief film 28a is formed in the space 24 located between the silicon compound layer 23 and the first sidewall 19A. A second stress-relief film 28x is formed on a side surface of the recessed portion 20 formed in the isolation region 11 on a lateral side of the sidewall 19X for interconnect. A protective film 28b is formed on a side surface of the n-type source/drain region 27b (specifically, on a surface exposed in the recessed portion 20). A protective film 28c which covers the third gate electrode 14c, the third offset spacer 16c, the third sidewall 19C, and the second p-type source/drain region 27c, is formed on the third active region 10c. After that, the resist pattern is removed.

Figure 6A:
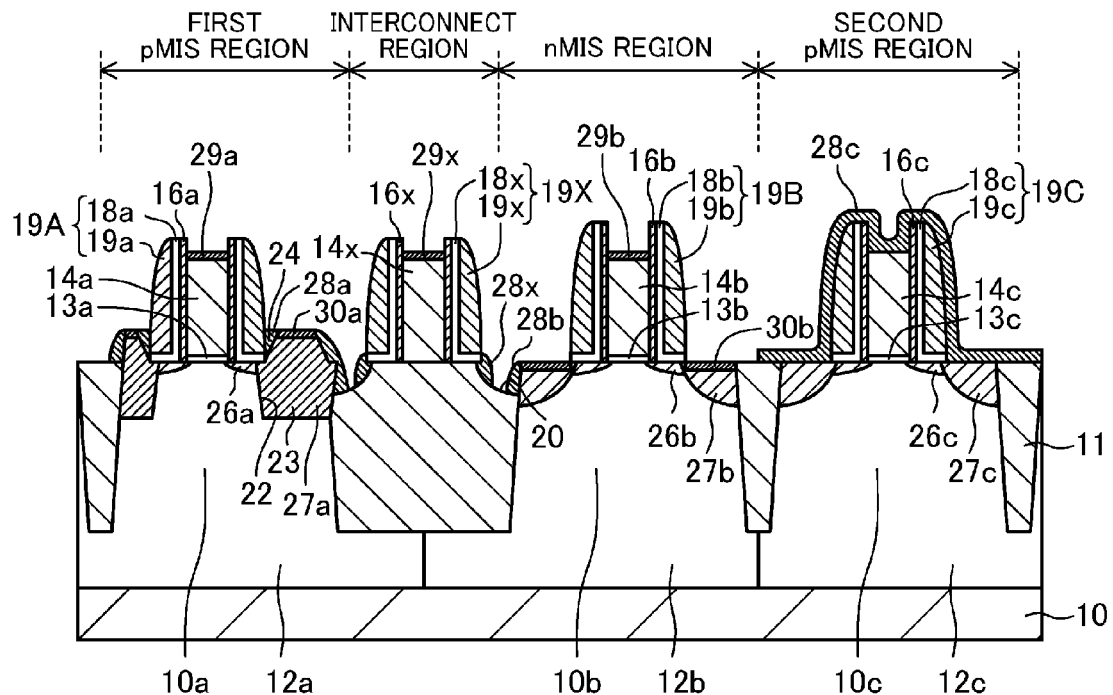
FIGS. 6A-6B are cross-sectional views of the semiconductor device according to one embodiment of the present disclosure in the gate length direction which sequentially show steps of fabricating the semiconductor device.

Next, as shown in FIG. 6A, a silicidation metal film (not shown) made, for example, of nickel (Ni) having a thickness of 10 nm is formed on the entire surface of the semiconductor substrate 10 by, for example, a sputtering process. After that, by a thermal treatment, Si contained in the first and second gate electrodes 14a, 14b and the gate interconnect 14x, the first p-type source/drain region 27a including the silicon compound layer 23, and the n-type source/drain region 27b, and Ni contained in the silicidation metal film are caused to react with each other. As a result, first and third silicide layers 29a, 29b made of nickel silicide having a thickness of 15 nm are formed on the first and second gate electrodes 14a, 14b, respectively. A silicide layer 29x for interconnect made of nickel silicide having a thickness of 15 nm is formed on the gate interconnect 14x. Second and fourth silicide layers 30a, 30b made of nickel silicide having a thickness of 15 nm are formed on the first p-type source/drain region 27a and the n-type source/drain region 27b, respectively. The second silicide layer 30a may contain germanium (Ge) contained in the silicon compound layer 23.

Here, the side surface of the n-type source/drain region 27b (specifically, the surface exposed in the recessed portion 20) is covered by the protective film 28b. Thus, the silicidation metal film can be formed in contact with only the surface of the n-type source/drain region 27b, without being formed in contact with the side surface of the n-type source/drain region 27b. As a result, not a fourth silicide layer which is formed on the surface and the side surface of the n-type source/drain region 27b, and whose cross-section has an L shape, but a fourth silicide layer 30b which is formed on the surface of the n-type source/drain region 27b, and whose cross-section has an I shape can be obtained as shown in FIG. 6A.

Since the upper surface of the third gate electrode 14c is covered by the protective film 28c, no silicide layer is formed on the third gate electrode 14c. Since the surface of the second p-type source/drain region 27c is covered by the protective film 28c, no silicide layer is formed on the second p-type source/drain region 27c.

Then, part of the silicidation metal film left on the isolation region 11, the first and second sidewalls 19A, 19B, the sidewall 19X for interconnect, the protective film 28c, etc., (in other words, unreacted part) is removed. After that, the silicide composition ratios of the first and third silicide layers 29a, 29b, the silicide layer 29x for interconnect, and the second and fourth silicide layers 30a, 30b are stabilized by a thermal treatment.

Figure 6B:
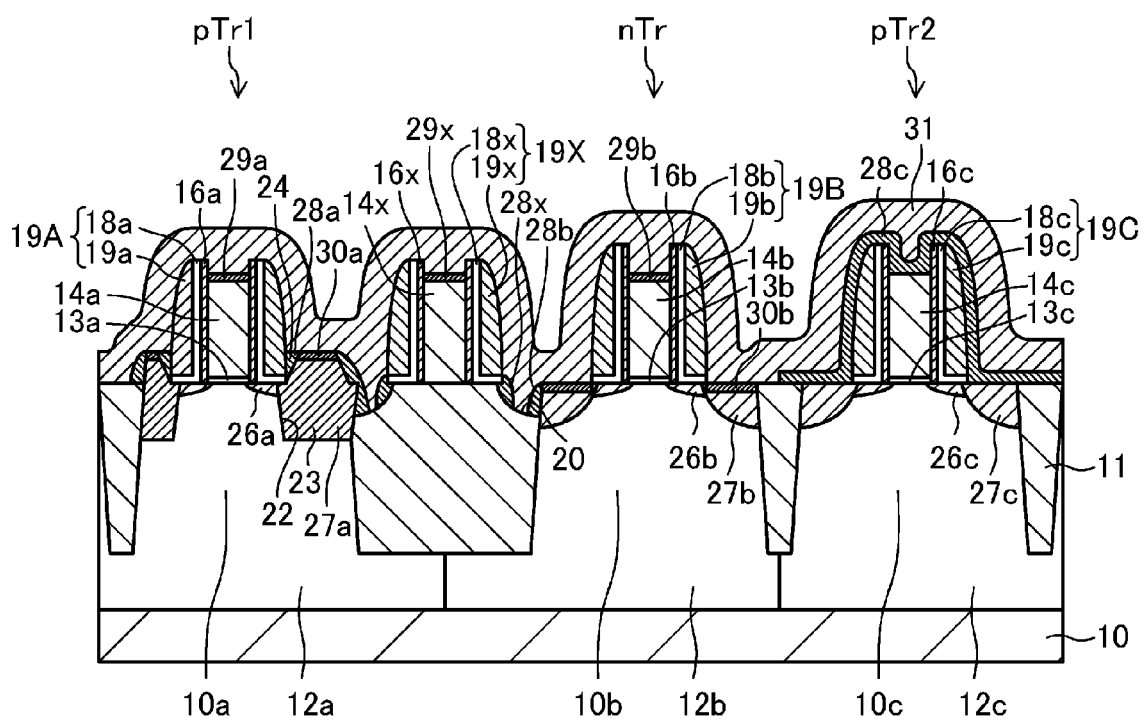

Next, as shown in FIG. 6B, a stress insulating film 31 which causes a tensile stress in the gate length direction of the channel region in the second active region 10b is deposited on the entire surface of the semiconductor substrate 10 by, for example, a CVD process.

After that, although not shown, an interlayer insulating film is formed on the stress insulating film 31, and thereafter, contact plugs are formed in the stress insulating film 31 and the interlayer insulating film. Then, an interconnect connected to the contact plug is formed on the interlayer insulating film.

In this manner, the semiconductor device according to the present embodiment can be fabricated.

A structure of a semiconductor device according to one embodiment of the present disclosure will be described with reference to FIG. 6B.

As shown in FIG. 6B, a semiconductor device of the present embodiment includes a first MIS transistor pTr1 formed in a first pMIS region of a semiconductor substrate 10, a second MIS transistor nTr formed in an nMIS region of the semiconductor substrate 10, and a third MIS transistor pTr2 formed in a second pMIS region of the semiconductor substrate 10. The conductivity types of the first and third MIS transistors pTr1, pTr2 are p type. The conductivity type of the second MIS transistor nTr is n type.

The first MIS transistor pTr1 includes: a first gate insulating film 13a formed on a first active region 10a; a first gate electrode 14a formed on the first gate insulating film 13a; a first offset spacer 16a which is formed on a side surface of the first gate electrode 14a and whose cross-section has an I shape; a first p-type extension region 26a formed in the first active region 10a on a lateral side of the first gate electrode 14a; a first sidewall 19A formed on the side surface of the first gate electrode 14a with the first offset spacer 16a interposed therebetween; a first p-type source/drain region 27a which includes a silicon compound layer 23 and is formed in a trench 22 formed in the first active region 10a on a lateral side of the first sidewall 19A; a first silicide layer 29a formed on the first gate electrode 14a; a second silicide layer 30a formed on the first p-type source/drain region 27a which includes the silicon compound layer 23; and a stress insulating film 31 formed on the first active region 10a to cover the first gate electrode 14a, the first offset spacer 16a, the first sidewall 19A, and the first p-type source/drain region 27a.

The silicon compound layer 23 causes a compressive stress in the gate length direction of the channel region in the first active region 10a. The height of the uppermost surface of the silicon compound layer 23 is higher than the surface of the semiconductor substrate 10 located directly under the first gate electrode 14a. In other words, the silicon compound layer 23 includes a portion formed in the trench 22, and a protruding portion located on the portion formed in the trench 22. A first stress-relief film 28a is formed in the space 24 between the silicon compound layer 23 and the first sidewall 19A. In other words, the first stress-relief film 28a is formed on the side surface of the silicon compound layer 23.

The semiconductor device according to the present embodiment includes: an isolation region 11 formed in the semiconductor substrate 10 to surround the first, second and third active regions 10a, 10b, 10c; a gate interconnect 14x formed on the isolation region 11 located between the first active region 10a and the second active region 10b; an offset spacer 16x for interconnect formed on a side surface of the gate interconnect 14x; a sidewall 19X for interconnect formed on the side surface of the gate interconnect 14x, with the offset spacer 16x for interconnect interposed therebetween; a second stress-relief film 28x formed on a side surface of a recessed portion 20 located in the isolation region 11 on a lateral side of the sidewall 19X for interconnect; a silicide layer 29x for interconnect formed on the gate interconnect 14x; and a stress insulating film 31 formed on the isolation region 11 to cover the gate interconnect 14x, the offset spacer 16x for interconnect, the sidewall 19X for interconnect, and the second stress-relief film 28x.

The second MIS transistor nTr includes: a second gate insulating film 13b formed on a second active region 10b; a second gate electrode 14b formed on the second gate insulating film 13b; a second offset spacer 16b which is formed on a side surface of the second gate electrode 14b and whose cross-section has an I shape; an n-type extension region 26b formed in the second active region 10b on a lateral side of the second gate electrode 14b; a second sidewall 19B formed on the side surface of the second gate electrode 14b with the second offset spacer 16b interposed therebetween; an n-type source/drain region 27b formed in the second active region 10b on a lateral side of the second sidewall 19B; a third silicide layer 29b formed on the second gate electrode 14b; a fourth silicide layer 30b formed on the n-type source/drain region 27b; a stress insulating film 31 formed on the second active region 10b to cover the second gate electrode 14b, the second offset spacer 16b, the second sidewall 19B, and the n-type source/drain region 27b.

The third MIS transistor pTr2 includes: a third gate insulating film 13c formed on the third active region 10c; a third gate electrode 14c formed on the third gate insulating film 13c; a third offset spacer 16c which is formed on a side surface of the third gate electrode 14c and whose cross-section has an I shape; a second p-type extension region 26c formed in the third active region 10c on a lateral side of the third gate electrode 14c; a third sidewall 19C formed on the side surface of the third gate electrode 14c with the third offset spacer 16c interposed therebetween; a second p-type source/drain region 27c formed in the third active region 10c on a lateral side of the third sidewall 19C; a protective film 28c formed on the third active region 10c to cover the third gate electrode 14c, the third offset spacer 16c, the third sidewall 19C, and the second p-type source/drain region 27c; and a stress insulating film 31 formed on the protective film 28c.

The first, second and third sidewalls 19A, 19B, 19C include first, second and third inner sidewalls 18a, 18b, 18c, respectively, which are formed on the side surfaces of the first, second and third gate electrodes 14a, 14b, 14c and whose cross-sections have an L shape, and first, second and third outer sidewalls 19a, 19b, 19c formed on the first, second and third inner sidewalls 18a, 18b, 18c, respectively. The sidewall 19X for interconnect includes an inner sidewall 18x for interconnect which is formed on a side surface of the gate interconnect 14x and whose cross-section has an L-shape, and an outer sidewall 19x for interconnect formed on the inner sidewall 18x for interconnect.

The first stress-relief film 28a, the second stress-relief film 28x, the protective film 28b, and the protective film 28c are made of a same insulating material.

According to the present embodiment, as shown in FIG. 3A, the height of the uppermost surface of the silicon compound layer 23 is higher than the height of the surface of the semiconductor substrate 10 located directly under the first gate electrode 14a. In other words, the silicon compound layer 23 includes a portion formed in the trench 22 and a protruding portion located on the portion formed in the trench 22, is formed. As a result, the space 24 can be formed between the silicon compound layer 23 and the first sidewall 19A as shown in FIG. 3A, and the first stress-relief film 28a can be formed in the space 24 as shown in FIG. 5B. Consequently, as shown in FIG. 6B, the protruding portion of the silicon compound layer 23 and the first stress-relief film 28a can be interposed between the stress insulating film 31 and the channel region in the first active region 10a. This means that the stress insulating film 31 can be separated from the channel region in the first active region 10a by the thicknesses of the protruding portion of the silicon compound layer 23 and the first stress-relief film 28a. In this structure, it is possible to reduce the tensile stress applied from the stress insulating film 31 to the channel region in first active region 10a in the gate length direction. As a result, it is possible to prevent a reduction in drive capability of the first MIS transistor pTr1 due to a decrease in the mobility of holes.

Further, the compressive stress from the silicon compound layer 23 can be applied to the channel region in the first active region 10a in the gate length direction. It is therefore possible to improve the drive capability of the first MIS transistor pTr1. Moreover, the silicon compound layer 23 includes the portion formed in the trench 22, and the protruding portion formed on the portion formed in the trench 22, as described above and shown in FIG. 3A. Thus, the thickness of the silicon compound layer 23 can be increased by the thickness of the protruding portion of the silicon compound layer 23. Therefore, the compressive stress can be efficiently applied to the channel region in the first active region 10a in the gate length direction. Consequently, it is possible to improve the drive capability of the first MIS transistor pTr1.

Further, the tensile stress from the stress insulating film 31 can be applied to the channel region in the second active region 10b in the gate length direction. As a result, it is possible to increase the mobility of electrons, and improve the drive capability of the second MIS transistor nTr.

Further, as shown in FIG. 5B, the protective film 28b can be formed on the side surface of the n-type source/drain region 27b (specifically, the surface exposed in the recessed portion 20) to cover the side surface of the n-type source/drain region 27b by the protective film 28b. Accordingly, the silicidation metal film is not formed in contact with the side surface of the n-type source/drain region 27b. Thus, as shown in FIG. 6A, the fourth silicide layer 30b whose cross-section has an I shape, not an L shape, can be formed. As a result, the fourth silicide layer 30b can be formed away from the bottom (i.e., the junction surface) of the n-type source/drain region 27b, and thus, it is possible to prevent a leakage current in the n-type source/drain region 27b.

Further, as shown in FIG. 5B, the protective film 28c is formed on the third active region 10c to cover the third gate electrode 14c, the third offset spacer 16c, the third sidewall 19C and the second p-type source/drain region 27c. Thus, as shown in FIG. 6B, the protective film 28c can be interposed between the stress insulating film 31 and the channel region in the third active region 10c. This means that the stress insulating film 31 can be separated from the channel region in the third active region 10c by the thickness of the protective film 28c. In this structure, it is possible to reduce the tensile stress applied from the stress insulating film 31 to the channel region in the third active region 10c in the gate length direction. As a result, it is possible to prevent a reduction in drive capability of the third MIS transistor pTr2 due to a decrease in the mobility of holes. The protective film 28c does not only serve as a film which prevents the formation of the silicide layer, but also serves as a film which reduces the tensile stress applied from the stress insulating film 31, as shown in FIG. 6A.

Here, if the cross-section of the protruding portion of the silicon compound layer 23 is a trapezoid as shown in FIG. 3A, the term "uppermost surface" of the silicon compound layer 23 as used in the present specification refers to the upper base of the trapezoid. If the protruding portion of the silicon compound layer 23 has, for example, an angle section, the term "uppermost surface" refers to the apex (i.e., the uppermost point) of the angle.

In the present embodiment, a specific example in which the first p-type extension implantation region 17a is formed, and then, the n-type extension implantation region 17b is formed, and thereafter, the second p-type extension implantation region 17c having a p-type impurity concentration lower than the first p-type extension implantation region 17a is formed, is described as shown in FIG. 1A. In other words, a specific example in which the first and second p-type extension implantation regions 17a, 17c are formed in separate processes so that the first and second p-type extension implantation regions 17a, 17c may have different p-type impurity concentrations, is described. However, the present disclosure is not limited to this example. For example, the first and second p-type extension implantation regions may be formed in the same process, and the first and second p-type extension implantation regions may have the same p-type impurity concentration.

In the present embodiment, a specific example in which the first active region 10a is subjected to, for example, dry etching to form the trench 22, is described as shown in FIG. 2B. However, the present disclosure is not limited to this example. For example, the first active region may be subjected to anisotropic wet etching to form a trench which includes a <111> plane on the side surface. In such a case, the side surface of the trench can be closer to the channel region in the first active region, and thus, it is possible to efficiently apply the compressive stress from the silicon compound layer formed in the trench to the channel region in the first active region in the gate length direction.

In the present embodiment, as an example method for forming the gate insulating film formation film, a specific example in which the gate insulating film formation film is formed on only the first, second and third active regions 10a, 10b, 10c by an ISSG oxidation process, and no gate insulating film for interconnect is interposed between the isolation region 11 and the gate interconnect 14x, is described. However, the present disclosure is not limited to this example. For example, as a method for forming the gate insulating film formation film, a CVD process may be used to form the gate insulating film formation film on the semiconductor substrate, and a gate insulating film for interconnect may be interposed between the isolation region and the gate interconnect.

In the present embodiment, a specific example in which the first, second and third gate electrodes 14a, 14b, 14c made, for example, of a polysilicon film are formed on the first, second and third gate insulating films 13a, 13b, 13c made, for example, of a silicon oxide film, is described. However, the present disclosure is not limited to this example. For example, first, second and third gate electrodes which include a metal film and a silicon film formed on the metal film may be provided on first, second and third gate insulating films which include an underlying film and a high dielectric constant film formed on the underlying film. The underlying film is made, for example, of a silicon oxide film or a silicon oxynitride film. The high dielectric constant film is made, for example, of a hafnium oxide film or a zirconium oxide film having a relative dielectric constant of eight or more. The metal film is made, for example, of titanium nitride (TiN) or tantalum nitride (TaN). The silicon film is made, for example, of a polysilicon film. In this case, an underlying film and a high dielectric constant film are interposed, or a high dielectric constant film is interposed, between the isolation region and the gate interconnect.

In the present embodiment, a specific example in which the silicidation metal film made of Ni is used to form the first, third, second, and fourth silicide layers 29a, 29b, 30a, 30b made of nickel silicide is described. However, the present disclosure is not limited to this example. For example, the silicidation metal film made of platinum or cobalt instead of Ni may be used to form the first, third, second, and fourth silicide layers made of platinum silicide or cobalt silicide.

In the present embodiment, a specific example in which the conductivity type of the first MIS transistor pTr1 is p-type, the conductivity type of the second MIS transistor nTr is n-type, is described. However, the present disclosure is not limited to this example. For example, the conductivity type of the first MIS transistor may be n-type, and the conductivity type of the second MIS transistor may be p-type. In this case, the conductivity types of the extension region and the source/drain region of each of the first and second MIS transistors are opposite to the conductivity types of the extension region and the source/drain region according to the present embodiment. Also, in this case, a layer (e.g., a SiC layer) which causes a tensile stress in the gate length direction of the channel region in the first active region is used as a silicon compound layer. A film which causes a compressive stress in the gate length direction of the channel region in the second active region is used as a stress insulating film.

Variation of One Embodiment

Figure 7A:
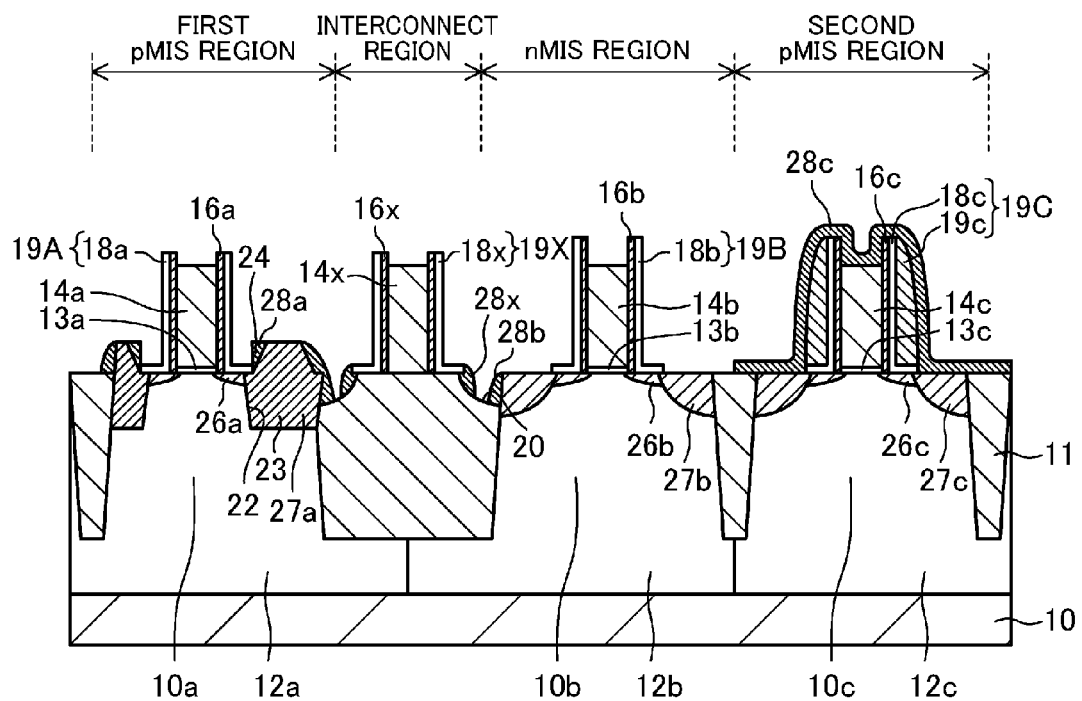
FIGS. 7A-7B are cross-sectional views of a semiconductor device according to a variation of one embodiment of the present disclosure in the gate length direction which sequentially show steps of fabricating the semiconductor device.
Figure 7B:
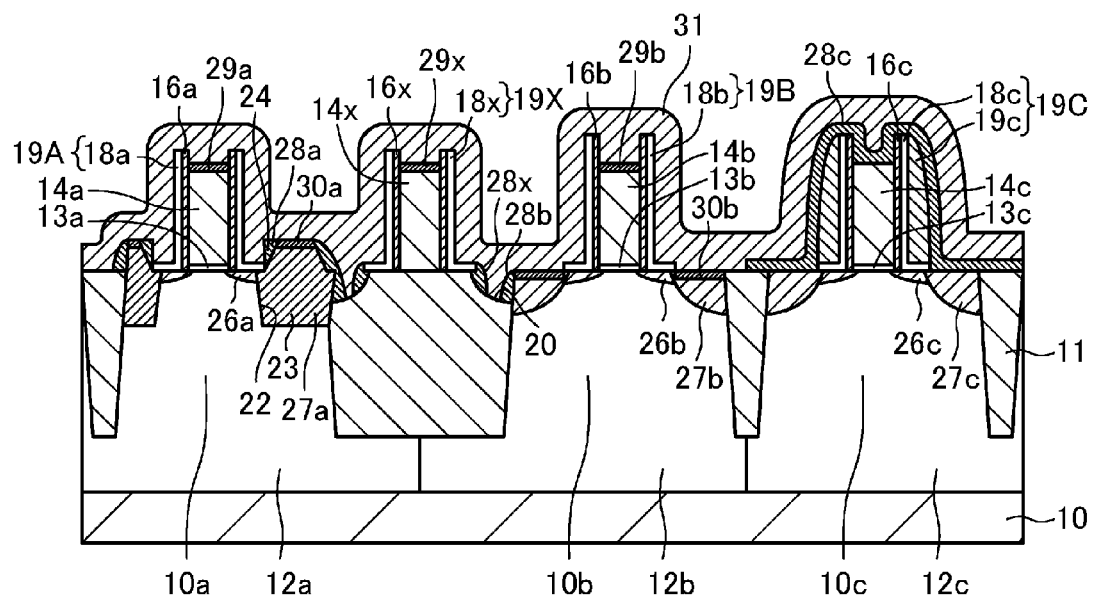
Figure 8A:
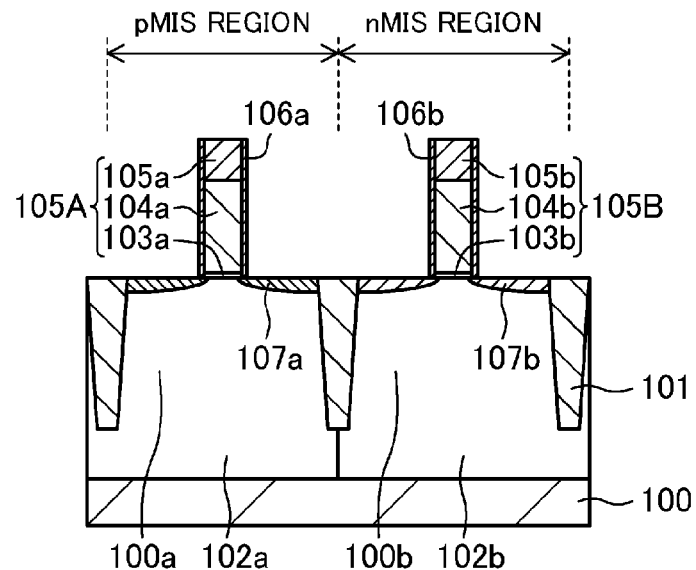
FIGS. 8A-8C are cross-sectional views of a conventional semiconductor device in the gate length direction which sequentially show steps of fabricating the conventional semiconductor device.
Figure 8B:
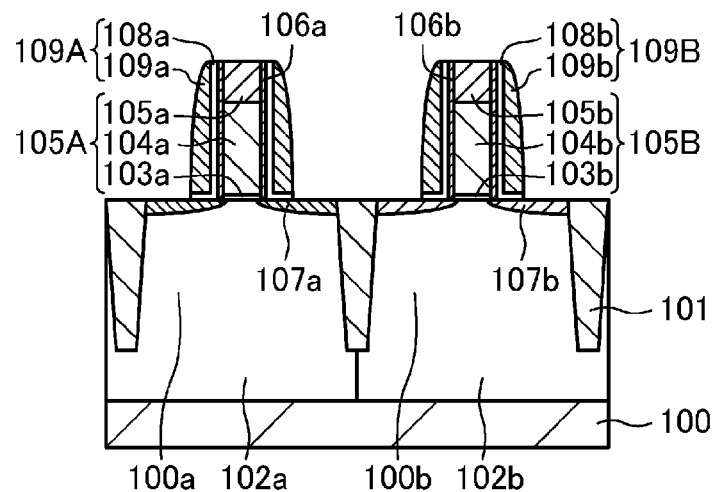
Figure 8C:
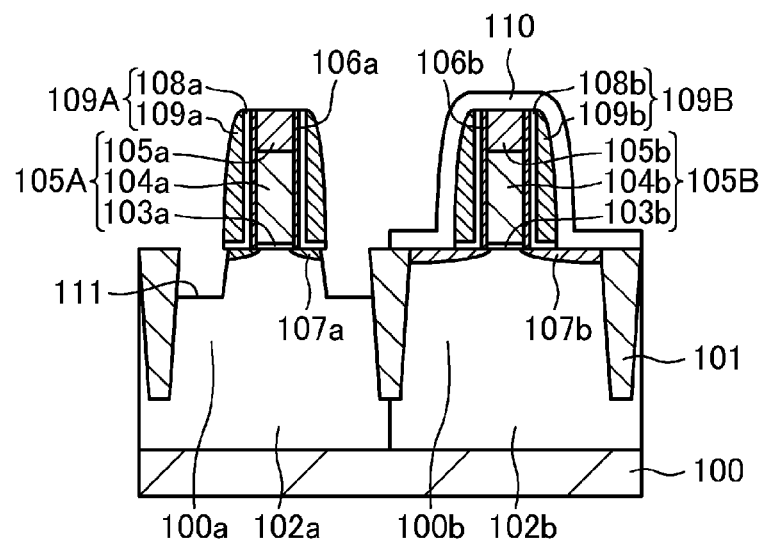
Figure 9A:
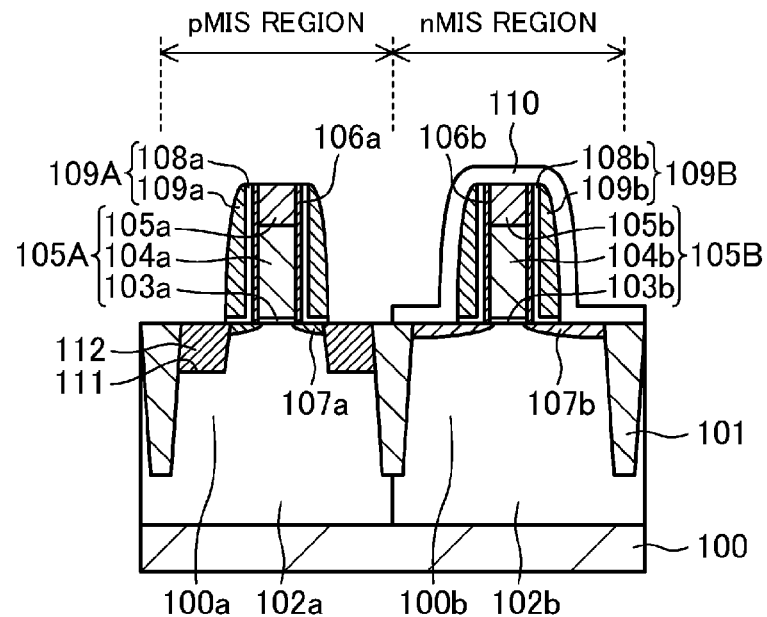
FIGS. 9A-9C are cross-sectional views of the conventional semiconductor device in the gate length direction which sequentially show steps of fabricating the conventional semiconductor device.
Figure 9B:
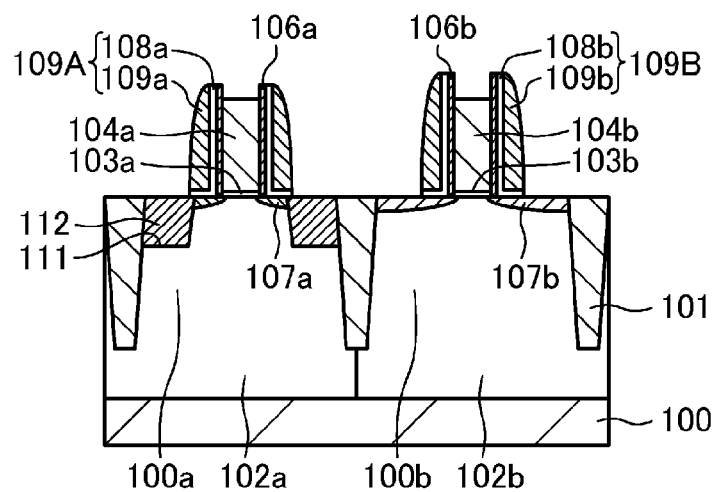
Figure 9C:
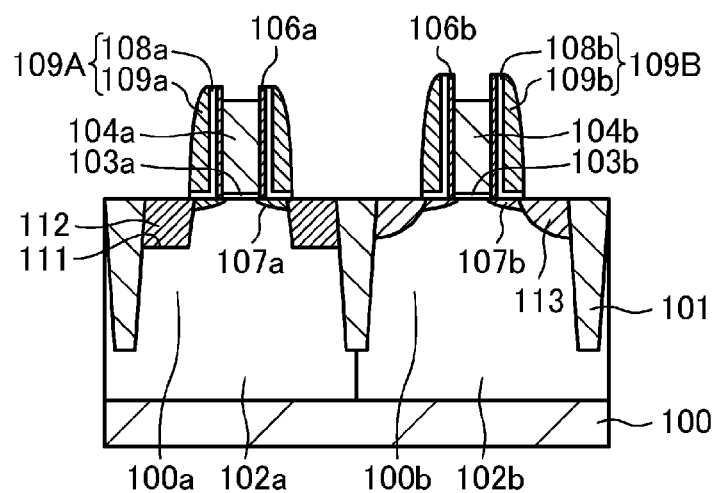
Figure 10A:
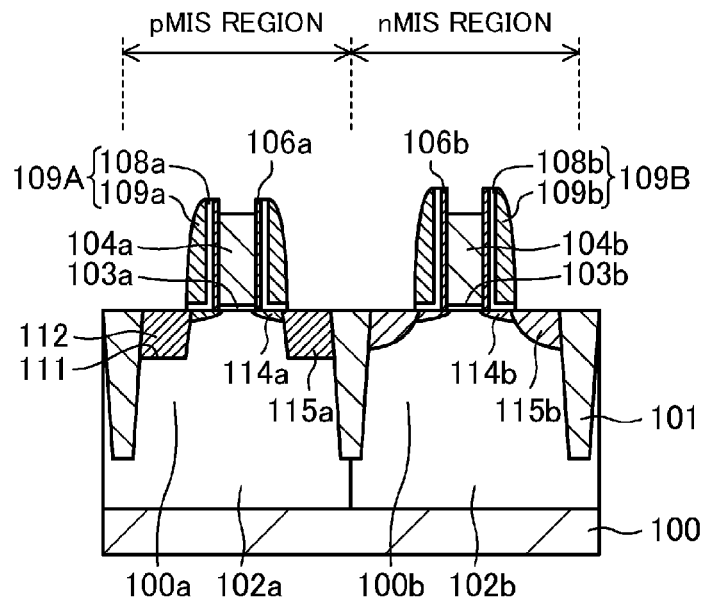
FIGS. 10A-10C are cross-sectional views of the conventional semiconductor device in the gate length direction which sequentially show steps of fabricating the conventional semiconductor device.
Figure 10B:
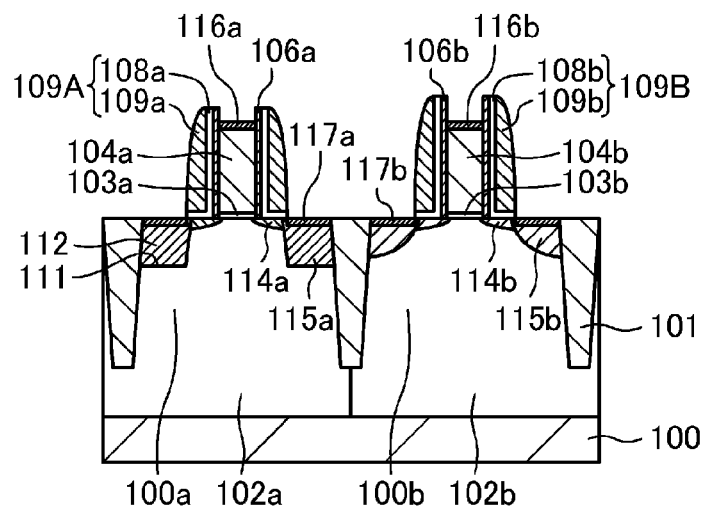
Figure 10C:
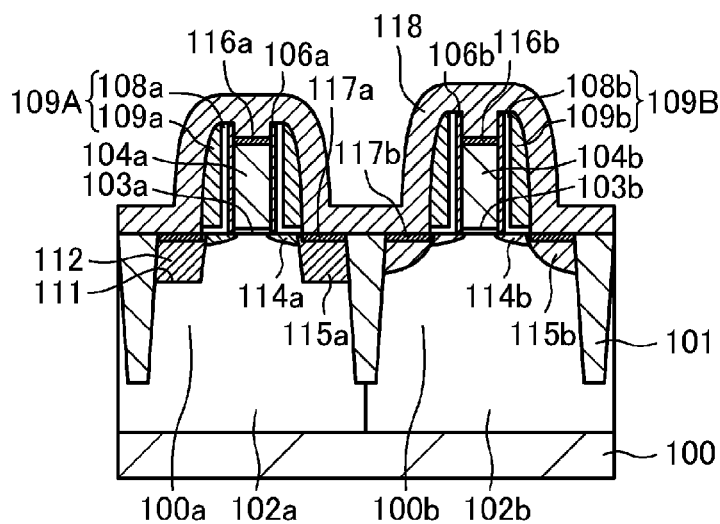

A method for fabricating a semiconductor device according to a variation of one embodiment of the present disclosure will be described below with reference to FIGS. 7A-7B. FIGS. 7A-7B are cross-sectional views of a semiconductor device according to a variation of one embodiment of the present disclosure in the gate length direction which sequentially show steps of fabricating the semiconductor device. In FIGS. 7A-7B, like reference numbers shown in FIGS. 1A-6B have been used to designate the same elements as the elements of the one embodiment. Accordingly, descriptions similar to the one embodiment are appropriately omitted in the present variation.

Initially, steps similar to the steps shown in FIGS. 1A-5B are sequentially performed to obtain the structure similar to the structure shown in FIG. 5B.

Next, as shown in FIG. 7A, the first and second outer sidewalls 19a, 19b (i.e., silicon nitride films) of the first and second sidewalls 19A, 19B and the outer sidewall 19x for interconnect (i.e., a silicon nitride film) of the sidewall 19X for interconnect are removed by, for example, a wet etching process using hot phosphoric acid of 160° C. As a result, the surfaces of the first and second inner sidewalls 18a, 18b (i.e., silicon oxide films) and the inner sidewall 18x for interconnect (i.e., a silicon oxide film) which are curved to have L-shaped cross-sections, are exposed.

Next, as shown in FIG. 7B, first and third silicide layers 29a, 29b are formed on the first and second gate electrodes 14a, 14b. A silicide layer 29x for interconnect is formed on the gate interconnect 14x. Second and fourth silicide layers 30a, 30b are formed on the first p-type source/drain region 27a and the n-type source/drain region 27b. That is, the step similar to the step shown in FIG. 6A are performed.

Next, a stress insulating film 31 is formed on the entire surface of the semiconductor substrate 10. That is, the step similar to the step shown in FIG. 6B is performed. The stress insulating film 31 is formed in contact with the surfaces of the first and second inner sidewalls 18a, 18b and the inner sidewall 18x for interconnect which are curved to have L-shaped cross sections.

The semiconductor device according to the present variation can be formed in this manner.

The structure in the present variation is different from the structure in the one embodiment in the following points.

In the one embodiment, the first and second sidewalls 19A, 19B include the first and second inner sidewalls 18a, 18b and the first and second outer sidewalls 19a, 19b, as shown in FIG. 6B. The sidewall 19X for interconnect includes the inner sidewall 18x for interconnect and the outer sidewall 19x for interconnect. The stress insulating film 31 is formed in contact with the side surfaces of the first and second outer sidewalls 19a, 19b and the outer sidewall 19x for interconnect, and the top ends of the first and second inner sidewalls 18a, 18b and the inner sidewall 18x for interconnect.

In contrast to this, in the present variation, the first and second sidewalls 19A, 19B include only the first and second inner sidewalls 18a, 18b as shown in FIG. 7B. The sidewall 19X for interconnect includes only the inner sidewall 18x for interconnect. The stress insulating film 31 is formed in contact with the surfaces of the first and second inner sidewalls 18a, 18b and the inner sidewall 18x for interconnect which are curved to have L-shaped cross-sections.

According to the present variation, advantages similar to those of the one embodiment can be obtained.

In addition, since the stress insulating film 31 is formed after the second outer sidewall 19b is removed as shown in FIG. 7A, the stress insulating film 31 can be formed in contact with the surface of the second inner sidewall 18b which is curved to have an L-shaped cross-section as shown in FIG. 7B. Thus, the stress insulating film 31 can be closer to the channel region in the second active region 10b by the thickness of the removed second outer sidewall 19b. Accordingly, a tensile stress can be efficiently applied to the channel region in the second active region 10b in the gate length direction.

Further, since the thickness of the stress insulating film 31 can be increased by the thickness of the removed second outer sidewall 19b, a tensile stress can be efficiently applied to the channel region of the second active region 10b in the gate length direction.

As described above, according to the present disclosure, it is possible to prevent a reduction in the drive capability of an MIS transistor, and the present disclosure is useful for a semiconductor device which includes an MIS transistor having a source/drain region including a silicon compound layer, and for a method for fabricating the semiconductor device.

What is claimed is:

1. A semiconductor device, comprising:
a first MIS transistor, wherein:
the first MIS transistor includes:
   a first gate insulating film formed on a first active region in a semiconductor substrate,
   a first gate electrode formed on the first gate insulating film,
   a first sidewall spacer formed on a side surface of the first gate electrode,
   a first source/drain region of a first conductivity type which is formed in a trench provided in the first active region on a lateral side of the first sidewall spacer, and which includes a silicon compound layer causing a first stress in a gate length direction of a channel region in the first active region, and
   a stress insulating film which is formed on the first active region to cover the first gate electrode, the first sidewall spacer, and the first source/drain region, and which causes a second stress opposite to the first stress,
   an uppermost surface of the silicon compound layer is located higher than a surface of the semiconductor substrate located directly under the first gate electrode,
   a first stress-relief film is formed in a space between the silicon compound layer and the first sidewall spacer,
   the first stress-relief film is formed on the side surface of the first gate electrode with the first sidewall spacer interposed therebetween, and
   the first stress-relief film is not in direct contact with the side surface of the first gate electrode.

2. The semiconductor device of claim 1, further comprising:
a first offset spacer which is formed between the first gate electrode and the first sidewall spacer, and whose cross-section has an I shape.

3. The semiconductor device of claim 1, further comprising:
a first silicide layer formed on the first gate electrode; and
a second silicide layer formed on the first source/drain region which includes the silicon compound layer.

4. The semiconductor device of claim 1, wherein the first stress-relief film is formed on a side surface of the silicon compound layer.

5. The semiconductor device of claim 1, wherein the first sidewall spacer includes an inner sidewall spacer which is formed on the side surface of the first gate electrode, and whose cross-section has an L shape, and an outer sidewall spacer formed on the inner sidewall spacer.

6. The semiconductor device of claim 1, wherein
the first sidewall spacer includes an inner sidewall spacer whose cross-section has an L shape, and
the stress insulating film is formed in contact with a surface of the inner sidewall spacer which is curved to have an L-shaped cross-section.

7. The semiconductor device of claim 1, wherein
the first MIS transistor is a p-type MIS transistor,
the first stress is a compressive stress, and
the second stress is a tensile stress.

8. The semiconductor device of claim 1, wherein
the silicon compound layer is a SiGe layer,
the stress insulating film is a silicon nitride film, and
the first stress-relief film is a silicon oxide film.

9. The semiconductor device of claim 1, wherein
the first MIS transistor is an n-type MIS transistor,
the first stress is a tensile stress, and
the second stress is a compressive stress.

10. The semiconductor device of claim 1, further comprising:
an isolation region formed in the semiconductor substrate to surround the first active region;
a gate interconnect formed on the isolation region;
an interconnect sidewall spacer formed on a side surface of the gate interconnect;
a second stress-relief film formed on a side surface of a recessed portion provided in the isolation region on a lateral side of the interconnect sidewall spacer; and
the stress insulating film formed on the isolation region to cover the gate interconnect, the interconnect sidewall spacer, and the second stress-relief film.

11. The semiconductor device of claim 1, further comprising:
a second MIS transistor, wherein:
the second MIS transistor includes:
   a second gate insulating film formed on a second active region in the semiconductor substrate,
   a second gate electrode formed on the second gate insulating film, a second sidewall spacer formed on a side surface of the second gate electrode, a second source/drain region of a second conductivity type which is formed in the second active region on a lateral side of the second sidewall spacer, and the stress insulating film formed on the second active region to cover the second gate electrode, the second sidewall spacer, and the second source/drain region.

12. The semiconductor device of claim 11, wherein no first stress-relief film is formed on the second active region.

13. The semiconductor device of claim 1, further comprising:

a third MIS transistor, wherein:

the third MIS transistor includes:

a third gate insulating film formed on a third active region in the semiconductor substrate, a third gate electrode formed on the third gate insulating film, a third sidewall spacer formed on a side surface of the third gate electrode, a third source/drain region of a first conductivity type which is formed in the third active region on a lateral side of the third sidewall spacer, a protective film formed on the third active region to cover the third gate electrode, the third sidewall spacer, and the third source/drain region, and the stress insulating film formed on the protective film.

14. The semiconductor device of claim 13, wherein no silicide layer is formed on the third gate electrode and the third source/drain region.

15. The semiconductor device of claim 13, wherein the first stress-relief film and the protective film are made of a same insulating material.

* * * * *